(12) United States Patent
Guo

(10) Patent No.: US 12,170,185 B2
(45) Date of Patent: *Dec. 17, 2024

(54) VACUUM DEPOSITION INTO TRENCHES AND VIAS AND ETCH OF TRENCHES AND VIA

(71) Applicant: Ascentool, Inc., Palo Alto, CA (US)

(72) Inventor: George Xinsheng Guo, Palo Alto, CA (US)

(73) Assignee: Ascentool, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/349,140

(22) Filed: Jul. 8, 2023

(65) Prior Publication Data

US 2024/0021411 A1  Jan. 18, 2024

Related U.S. Application Data

(63) Continuation-in-part of application No. 18/346,967, filed on Jul. 5, 2023.
(Continued)

(51) Int. Cl.
*H01J 37/32* (2006.01)
*C23C 14/35* (2006.01)
*C23C 16/50* (2006.01)

(52) U.S. Cl.
CPC ........ *H01J 37/32394* (2013.01); *C23C 14/35* (2013.01); *C23C 16/50* (2013.01);
(Continued)

(58) Field of Classification Search
CPC ............... H01J 37/3266; H01J 37/3669; H01J 37/32394; H01J 37/32339;
(Continued)

(56) References Cited

U.S. PATENT DOCUMENTS 5,114,556 A * 5/1992 Lamont, Jr. ......... H01L 21/0217
257/E21.585
5,433,835 A   7/1995 Demaray
(Continued)

FOREIGN PATENT DOCUMENTS

JP   61-204371   *  9/1986
JP   01-201467   *  8/1989
(Continued)

OTHER PUBLICATIONS

Machine Translation JP 61-204371 (Year: 1986).*
(Continued)

*Primary Examiner* — Rodney G McDonald
(74) *Attorney, Agent, or Firm* — SV Patent Service

(57) ABSTRACT

A plasma deposition apparatus includes a first plasma source that can produce a first plasma confined in a magnetic field, which includes: a gas distribution device configured to supply a gas, a closed-loop electrode defining a center region therein and a central axis through the central region and one or more magnets that are outside an inner surface of the closed-loop electrode. The one or more magnets can produce the magnetic field in the center region. The closed-loop electrode and the one or more magnets can produce the first plasma of activated atoms, molecules, electrons, and ions from the gas. A collimator can collimate the activated atoms, molecules, electrons, and ions produced by the first plasma source and direct the ions to a substrate.

18 Claims, 23 Drawing Sheets

Related U.S. Application Data

(60) Provisional application No. 63/368,231, filed on Jul. 12, 2022.

(52) U.S. Cl.
CPC .. *H01J 37/32339* (2013.01); *H01J 37/32541* (2013.01); *H01J 37/32697* (2013.01); *H01J 2237/332* (2013.01)

(58) Field of Classification Search
CPC ........... H01J 37/32541; H01J 37/32697; H01J 37/32432; H01J 37/3447; H01J 2237/332; C23C 14/35; C23C 16/50
USPC .................................................. 204/298.11
See application file for complete search history.

(56) References Cited

U.S. PATENT DOCUMENTS

| | | |
|---|---|---|
| 5,814,196 A | 9/1998 | Hollars |
| 2007/0045108 A1 | 3/2007 | Demaray |

FOREIGN PATENT DOCUMENTS

| | | | |
|---|---|---|---|
| JP | 03-170669 | * | 7/1991 |
| JP | 04-048071 A | * | 2/1992 |
| JP | 06-128739 | * | 5/1994 |
| JP | 2001-81550 | * | 3/2001 |
| WO | WO88/02546 | * | 7/1988 |

OTHER PUBLICATIONS

Machine Translation JP 06 128739 (Year: 1994).*
Machine Translation JP 2001-81550 (Year: 2001).*
Machine Translation JP 01-201457 (Year: 1989).*
Machine Translation JP 03-170669 (Year: 1991).*
Machine Translation WO 88/02546 (Year: 1988).*
Machine Translation JP 04-048071 (Year: 1992).*

* cited by examiner

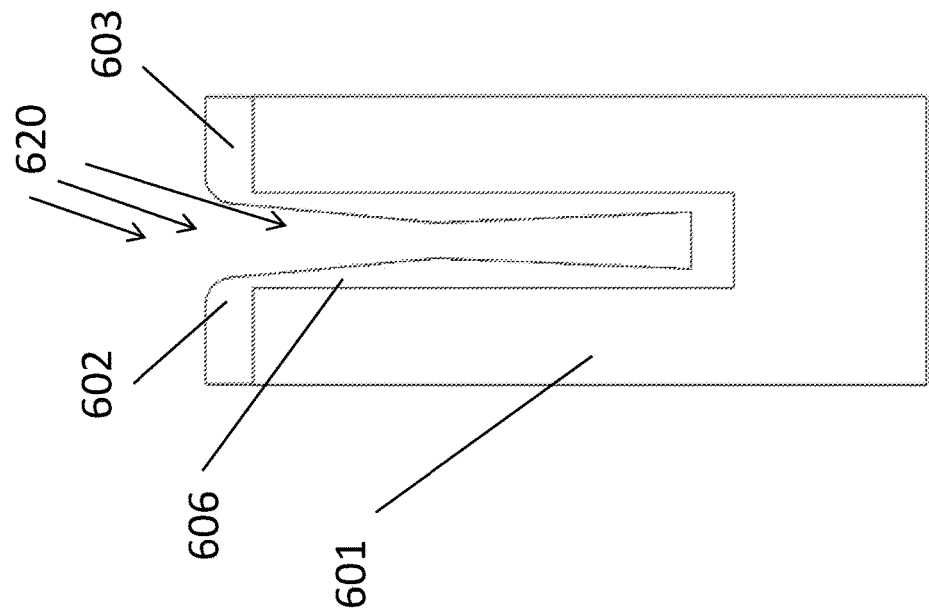
Fig.6C Etch of upper Trench sidewall
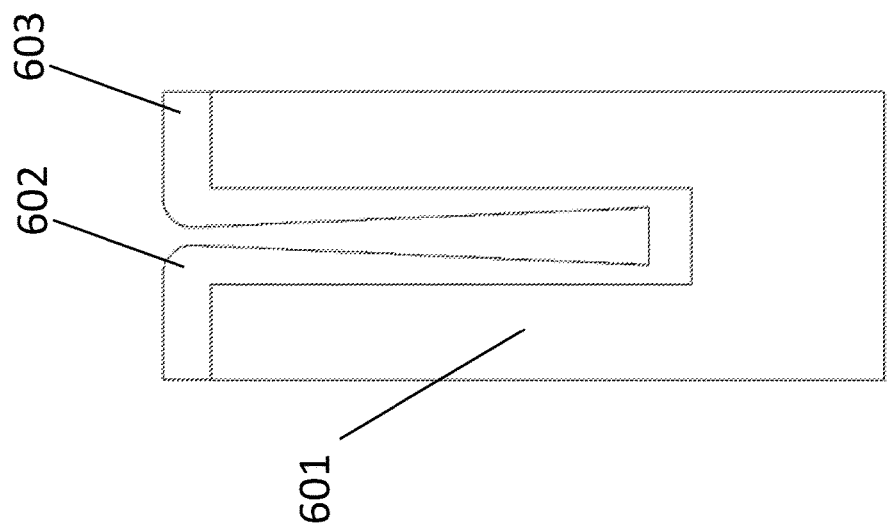
Fig.6B As-deposited film With overhang

VACUUM DEPOSITION INTO TRENCHES AND VIAS AND ETCH OF TRENCHES AND VIA

BACKGROUND OF THE INVENTION

The present application relates to material deposition and material removal technologies, and more specifically on semiconductor substrates using gases as either precursors or etchant gases.

Material depositions such as sputtering, chemical vapor deposition (CVD), and plasma enhanced CVD (PECVD) are widely used in semiconductor manufacturing. As the feature sizes of the devices get smaller over time, it becomes more difficult to deposit materials into the bottom of the devices such as trenches and via. Some applications require thick material at bottom of trenches and via while having little or no materials on sidewalls. Some other applications require more conformal or uniform coating on sidewalls while having little materials on the bottom of trenches and via.

To achieve deposition uniformity, the deposition sources are typically larger than the substrate. The angular distribution of the deposition atoms or ions is broad. The broad distribution can deposit more material at upper portion of sidewalls of trenches and via and pinch off the upper entrance of the trenches and via, preventing further deposition into trenches and via. It is desirable to ionize almost 100% of deposition atoms and form a parallel ion beam; or to block off the larger off-angle deposition atoms if 100% ionization is not possible.

The atoms or ions to be deposited must have strong directionality when they reach the wafer surfaces during deposition. Various ways of ionizing atoms and accelerating these ions to substrates can produce variable degrees of directionality, but all require low pressure operation to avoid gas scattering. The ions and atoms that collide with residue process gases before they reach the substrate surface increase the divergence angles of these ions and atoms. Lower pressure keeps the directionality of ions and atoms; increases deposition into the trenches and via; and enhances sputter etch or reactive etching of the trenches and via if needed.

In some applications, it is desirable to coat materials on the sidewalls of the trenches and via, leaving little film on the bottom of trenches or via. In some other applications, it is desirable to only coat the materials at the bottom of trenches and via, leaving little or no film on the sidewalls of the trenches and via. A precisely controlled parallel ion beam that can tilt in angle relative to the substrate is needed to either deposit film or etch the deposited film.

It is desirable to reduce the re-sputtering of materials near substrate surfaces and subsequent re-deposition onto the upper portion of sidewalls of the trenches and via. The re-deposit narrows the entrance of the trenches and via and causes void formation inside the trenches and via (pinching). Removal of the material at upper portion of sidewalls of trenches and via is desirable. In PECVD application, it is desirable to avoid inert gases in the plasma for some applications to avoid excess re-sputter and re-deposition of the trenches and via.

SUMMARY OF THE INVENTION

We have invented a plasma source that eliminates most of the electron leakage from the plasma source. The termination of plasma next to the anode or ground is improved to further reduce the loss of electrons. The plasma is extended further from the cathode or anode and more uniform plasma is achieved. The improved plasma greatly enhances the plasma density and lowers the operating pressure.

The present invention also disclosed a way to prevent deposition atoms that are not ionized from getting to the substrate. We invented a way to absorb or remove these depositing atoms that are not ionized after passing through the ionization plasma zone.

We invented a collimation apparatus that can block deposition in broad angles, accelerate ions and focus ions, tilt the direction of the accelerated ions, and rotate the accelerated ions. The collimation apparatus can limit the deposition on itself and reduce process drift, particulates formations, and shadowing of the substrate. The disclosed collimation apparatus and the method to use this apparatus improve the deposition and etch into high aspect ratio structures such as trenches and via on the substrate. Methods to reduce sputtering of the substrate and to remove the material near entrance of trenches and via are disclosed. We invented a way to shape the deposited materials inside trenches or via to prevent the subsequent clogging or closing near the entrance of the trenches or via and avoid the formation of voids inside trenches or via.

In some cases, the energetic ions can sputter the substrate and cause re-sputtering into the trenches or via and cause clogging. Lower ion velocity or lower substrate bias is desirable. We disclose a way to reduce this low voltage and still maintain the directionality of the ions coming to the substrate. For some applications, electro-static chucks (ESC or S-chuck) are powered by RF power to induce a voltage called self-bias voltage; this voltage requires plasma near the substrate and may be high due to the high power needed for process equipment throughput, low plasma density near the substrate, or geometry of various electrodes near the substrate. We disclosed ways to control this self-bias voltage and independent control of the self-bias voltage.

In one general aspect, the present invention relates to a plasma deposition apparatus that includes a first plasma source that can produce a first plasma confined in a magnetic field, which includes: a gas distribution device configured to supply a gas, a closed-loop electrode defining a center region therein and a central axis through the central region and one or more magnets that are outside an inner surface of the closed-loop electrode. The one or more magnets can produce the magnetic field in the center region. The closed-loop electrode and the one or more magnets can produce the first plasma of activated atoms, molecules, electrons, and ions from the gas. A collimator can collimate the activated atoms, molecules, electrons, and ions produced by the first plasma source and direct the ions to a substrate.

Implementations of the system may include one or more of the following. The closed-loop electrode can have a circular shape or a polygon shape. The one or more magnets can be positioned in a closed loop in the closed-loop electrode. The one or more magnets can be fully embedded in the closed-loop electrode. The one or more magnets can be partially embedded in the closed-loop electrode. The gas distribution device can be electrically biased relative to ground. The first plasma source can be disposed between the gas distribution device and the substrate, wherein the collimator is disposed between the first plasma source and the substrate. The collimator can include a first set of parallel ribbons and a second set of parallel ribbons, wherein the second set of parallel ribbons is displaced from the first set of parallel ribbons along the central axis, wherein the first set of parallel ribbons and the second set of parallel ribbons can be crossed at a substantial angle, wherein the first set of parallel ribbons and the second set of parallel ribbons can collimate the activated atoms, molecules, electrons, and ions produced by the first plasma source and to direct the ions to the substrate. The first set of parallel ribbons and the second set of parallel ribbons can be crossed substantially at an orthogonal angle. The first set of parallel ribbons can be electrically biased relative to the second set of parallel ribbons to steer the ions. At least some neighboring ribbons in the first set of parallel ribbons and the second set of parallel ribbons can be electrically biased relative to each other to steer the ions. The first set of parallel ribbons can be moveable by a first transport mechanism, wherein the second set of parallel ribbons are moveable by a second transport mechanism. The collimator can include an electrically conductive plate that include a plurality of holes, wherein the electrically conductive plate is electrically biased relative to the substrate such that electric potential at the plurality of holes is configured to focus and direct the ions to the substrate. The collimator can include a stack of plates each comprising a plurality of holes, wherein at least one of the plates can be electrically biased relative to the substrate such that electric potential at the plurality of holes in the at least one of the plates is configured to focus and direct the ions to the substrate. The first set of parallel ribbons can have surfaces substantially parallel to the central axis, wherein a second set of parallel ribbons can have surfaces substantially parallel to the central axis. The first set of parallel ribbons and the second set of parallel ribbons can be rotatable around the central axis. The first plasma source can further include an electrical coil configured to increase uniformity of the magnetic field in the center region. The plasma deposition apparatus can further include a second plasma source disposed between the collimator and the substrate, configured to generate a second plasma and neutralize ions in the first plasma.

In another general aspect, the present invention relates to a plasma deposition apparatus that includes a first plasma source that can produce a first plasma confined in a magnetic field, which includes a gas distribution device that can supply a gas, a closed-loop electrode defining a center region therein and a central axis through the central region, and one or more magnets that are outside an inner surface of the closed-loop electrode, wherein the one or more magnets can produce the magnetic field in the center region. The one or more magnets can be at least partially embedded in the closed-loop electrode. The closed-loop electrode and the one or more magnets can produce the first plasma of activated atoms, molecules, electrons and from the gas.

BRIEF DESCRIPTION OF DRAWINGS

FIGS. 5A and 5B also illustrate how additional gas can be introduced below the collimator and form plasma without strong directionality. The plasma etches the re-deposited film near the entrance of trenches and via. The additional plasma source can also create a plasma necessary for electro-static chuck to form self-bias voltage on substrate.

FIGS. 6B, 6C, 6D and 6E show step by step deposition, etching of upper trench walls, etching of the entire sidewall, and subsequent deposition to fill the trench in the vacuum deposition system in accordance with the present invention.

DETAILED DESCRIPTION OF THE INVENTION

Figure 1A:
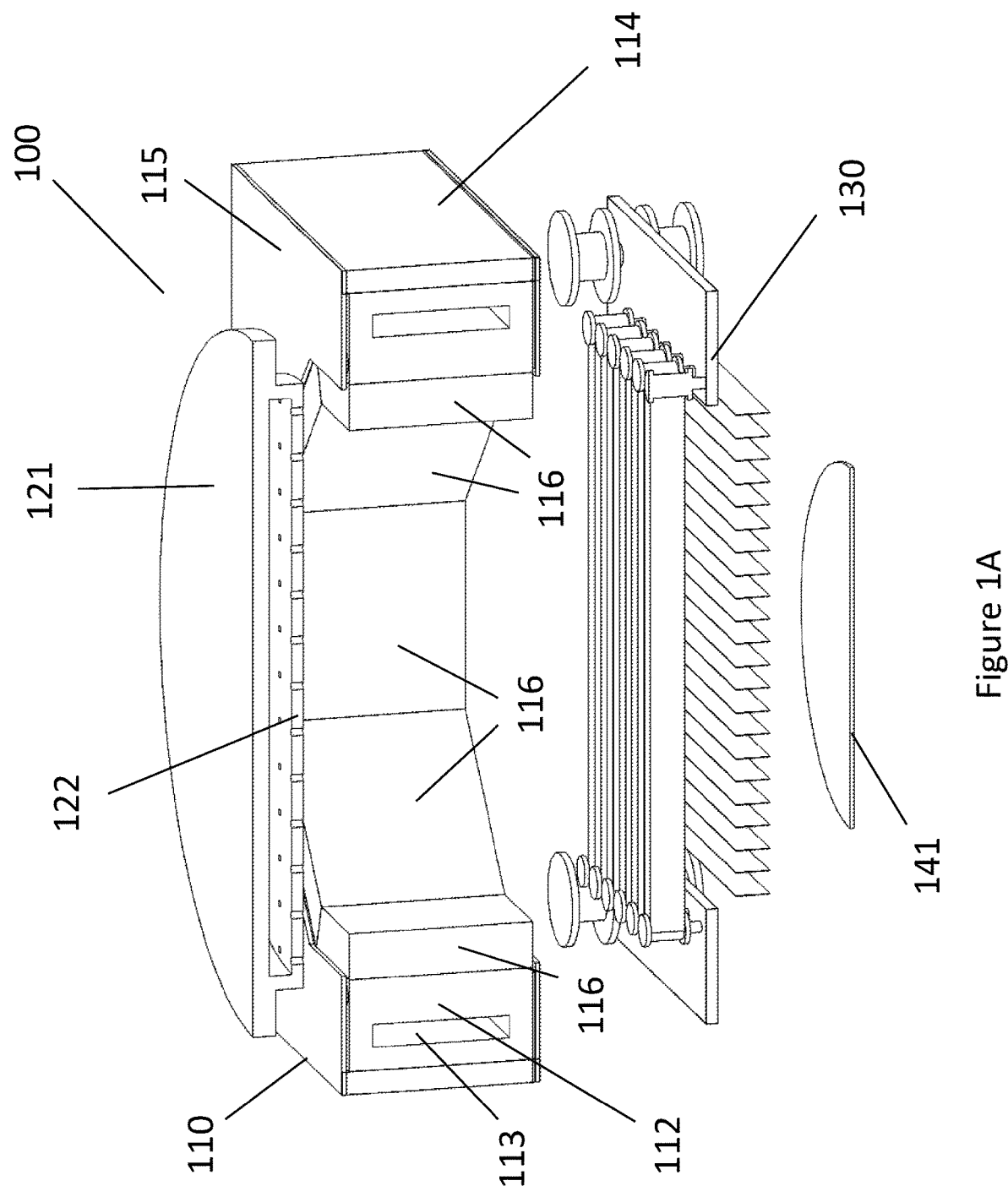
FIG. 1A is a sectional perspective view of a plasma deposition and etch apparatus that includes a substrate being deposited by precursor gases or etched by etchant gases from a gas distribution device, a three-dimensional closed-loop magnetron source as plasma sources, and a collimator in accordance with the present invention.

In order to send ions or atoms to the bottom of trenches or via, either perpendicular to substrate surface, or at a predetermined angle to the substrate center axis, the ions or atoms that travel at a larger angle off the substrate center axis have to be eliminated or greatly reduced. Deposition from larger off-axis angle ions and atoms preferentially deposit at upper portion of trench sidewalls and narrow the entrance of the trenches or via (pinching) and prevent subsequent void-free filling of the trench and via. Ions or atoms should form a substantially parallel beam either perpendicular to the substrate surface or at a predetermined angle in order to reach the bottom of trenches or the side walls of trenches. The sputtering of material near the surface of substrate into the upper part of the trenches and via can also pinch the trench or via. This invention will improve on all these challenges.

In case of plasma etch, off angle ions will damage and heat the substrate surface such as photo resist, without etching the bottom of trench and via. Our invention will reduce the off-angle ions.

FIGS. 1A-1D show a plasma deposition and etch apparatus 100. A collimator 130 is placed between a plasma source 110 and a substrate 141. The collimator 130 is a mechanical device that physically blocks off ions or atoms that hit the device and only allows ions and atoms that travel in a narrow angle to pass. The plasma source 110 is placed below the gas distribution device 121 to ionize the precursor or etchant molecules coming off the surface 122 of gas distribution device 121. The substrate 141 is biased by RF, AC or DC voltage and attracts the ions above and below the collimator 130 to the substrate. The collimator 130 collects most of the off-axis deposition before they reach substrate 141, while allowing the ions and atoms that are closely aligned with the axis of the collimator 130 to pass through. We have invented a plasma source 110 that forms a closed loop magnetic field in three-dimensional space, as shown in FIGS. 1A-1D. One or more electrodes 116 form a closed-loop electrode around a central region 150 defined by a central axis 151. When formed by multiple pieces, the electrodes 118 are electrically connected to stay at the same electric potential. The permanent magnets 118 behind the electrodes 116 form substantially parallel magnetic fields along the inner surfaces of the electrodes 116 and form a closed loop magnetic field along the inner surface of electrode 116. Once the electrodes of the plasma source are electrically biased, the electrons would be confined by the magnetic fields and hop along the inner surface of the electrodes 116 to ionize the gases from gas distribution device 121. The electrode 116 can be a cathode if the bias voltage is DC. When an RF power is applied, the electrode 116 can alternate between positive and negative electric polarity over time. Precursors can be activated but without being ionized and causes clogging of trenches. Collimator 130 provides large surface areas for the activated precursor molecules to react and deposit, reducing the percentage of random direction deposition on substrate 141.

Figure 4A:
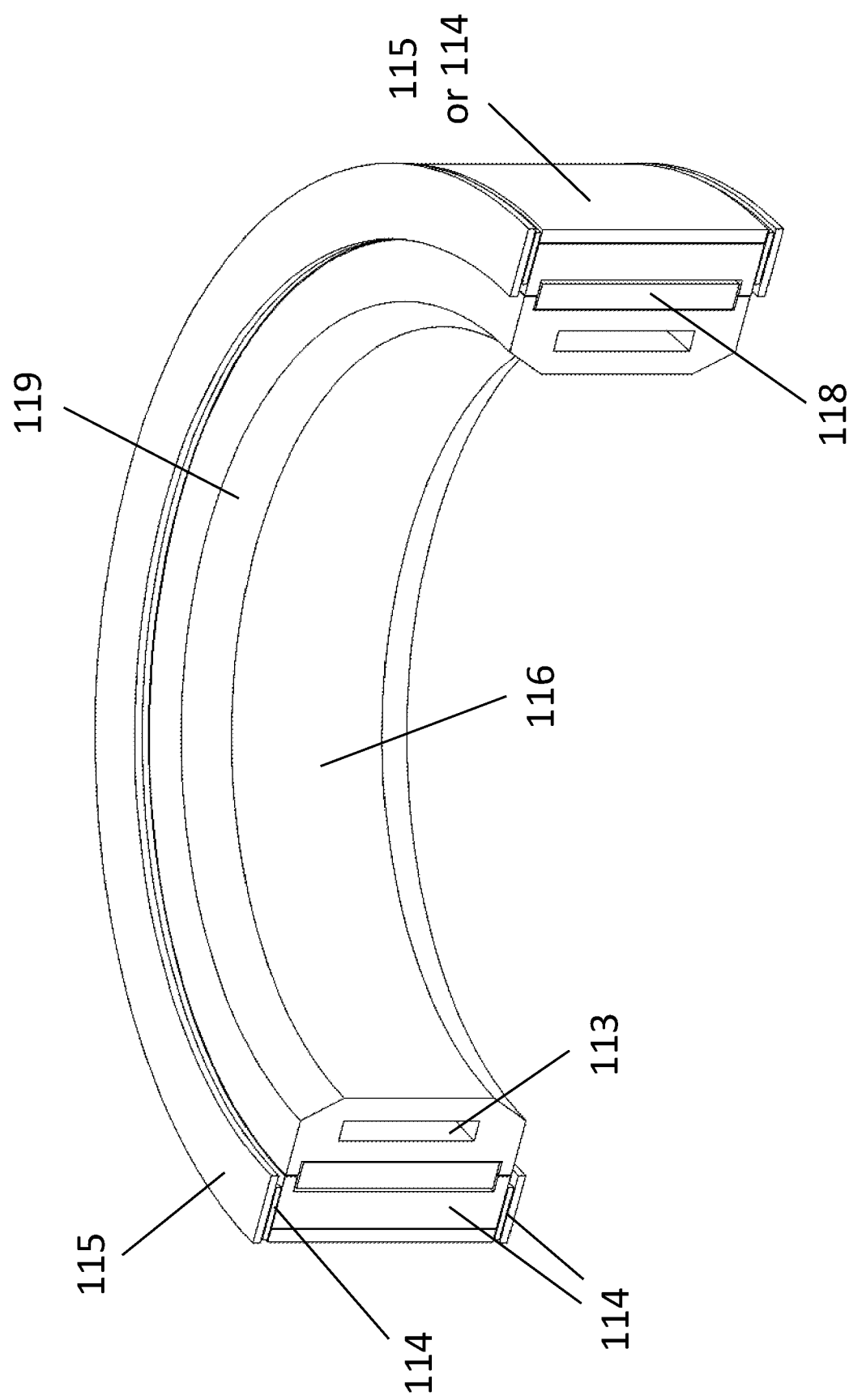
FIGS. 4A and 4B respectively show the perspective and sectional views of a high-density magnetron plasma source in the vacuum deposition system in accordance with the present invention.
Figure 4B:
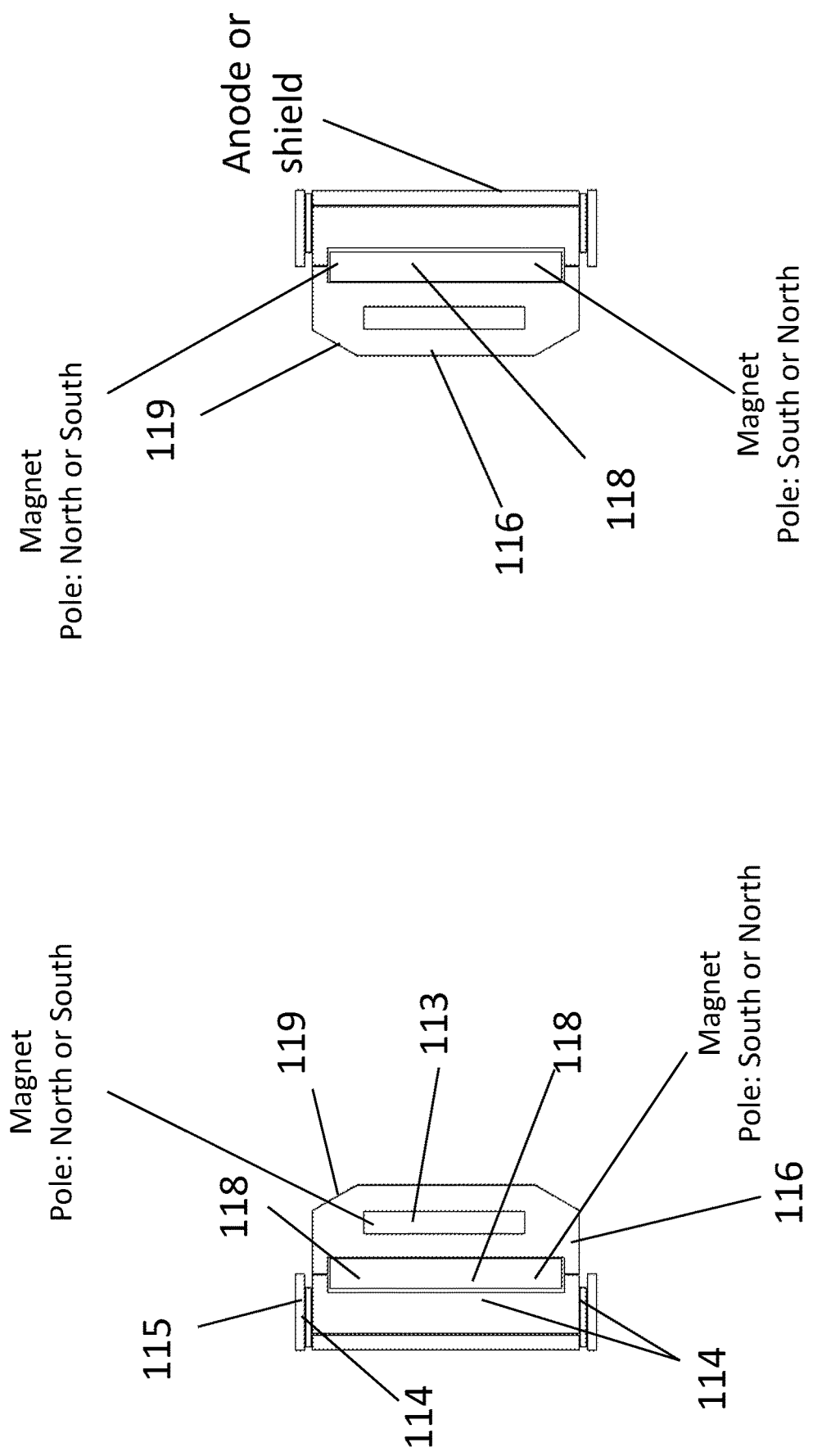

The ribbons 132 and 133 are guided by rollers 135 to form parallel walls and can be tensioned and moved by motors or tension devices attached to un-winding and rewinding wheel 134. The movement can provide fresh ribbons after too much deposition. A mounting plate 131 supports all the rollers and wheel and is attached to the vacuum chamber. One major challenge is to have high plasma density and low operating pressure to increase ionization probability at low pressure to avoid gas phase scattering and maintain the parallel ion beam. Since it takes at least one collision between ion and the cathode to generate at least one electron, the generated electron must fly as long distance as possible to ionize one or more atoms that can strike the cathode and generate another electron in order to maintain the plasma. The longer the electron can fly, the lower the operating pressure. The key is to have the best electron confinement before the electron is lost. Our test shows a three-dimensional closed loop magnetically confined plasma greatly reduces the electrons that can follow the magnetic flux and escape the confinement and enable much higher plasma density and much lower operating pressure (0.1 mTorr in DC mode and 0.02 mTorr using 13.56 MHz RF). A lower operating pressure would reduce the collisions by residue gases, improve the alignment of depositing ions or atoms, and reduce the percentage of inert gas ions that do not contribute to deposition but sputter the substrate surfaces. FIGS. 4A and 4B illustrate the electrode 116 to be in circular form to improve the plasma uniformity for circular substrates when the electrode 116 is used as a cathode if a DC bias voltage is applied.

Figure 4C:
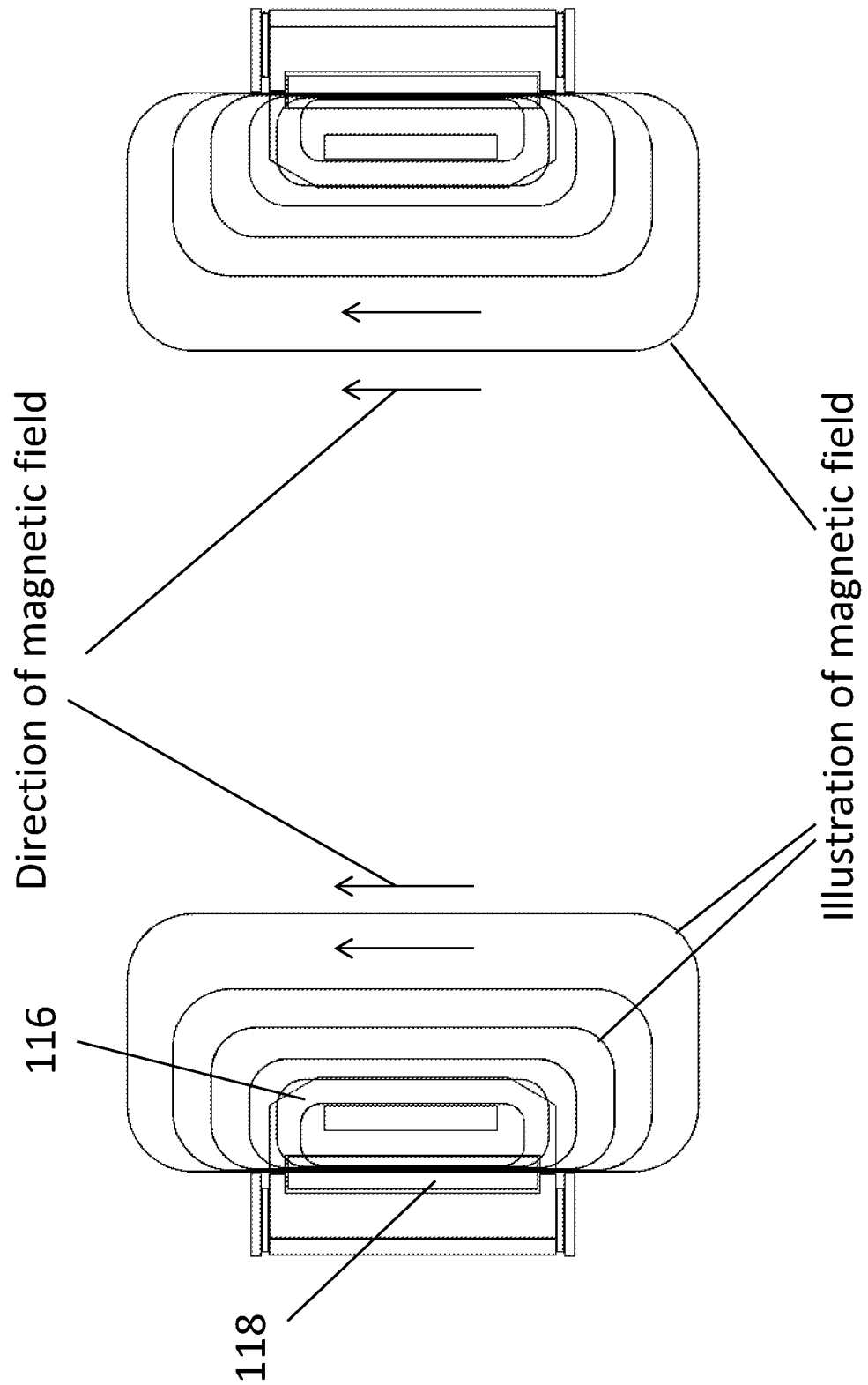
FIGS. 4C and 4D show the magnetic field illustration of the high-density plasma source in FIGS. 4A and 4B, and with an electrical magnet to extend the magnet field to the center of the process chamber. A vacuum chamber envelope is not shown for visual clarity.

The cross section of the electrode 116 should be such that only single continuous plasma is formed, not multiple plasma regions that can have inconsistent power distribution. One way is to have taper, fillet, or cut 119 at corner of the electrode 116 to ensure a smooth plasma transition. The electrode 116 can be liquid cooled with a cooling channel 113 and protected by insulators 114 and a shield 115 in the back and sides. Magnets 118 are generally permanent magnets and should be within the width of the electrode 116. Better plasma confinement is achieved when a part or the whole magnets 118 is inside the electrode 116. Magnets 118 are magnetized along the length to have a substantially parallel magnetic field along the inner surface of the electrode 116. Magnets 118 can be a continuous piece or made up of individual pieces with or without gaps between them to form a closed loop magnetic field. The magnets 118 can be cylindrical shaped or rectangular blocks. FIG. 4C illustrates the magnetic field distribution of present invention, the partially embedded magnets 118 inside the electrode 116 create a return path for magnetic field and electrons in plasma back to the electrode 116 and improve the plasma confinement efficiency.

The electrode 116 can be polygon shaped, or circular shaped. The cathode can be made of multiple sections to reduce the cost. The surface of cathode can be coated or anodized to minimize metal contamination or extend the lifetime of the cathode. The cathode can be powered by DC, AC, or RF power sources. In case of AC or RF, a DC bias can be applied to the cathode through a coil that prevents shorting the AC or RF power to the anode or DC power supply. A low DC or zero DC bias can prevent sputtering of the cathode and still maintain plasma.

Figure 4D:
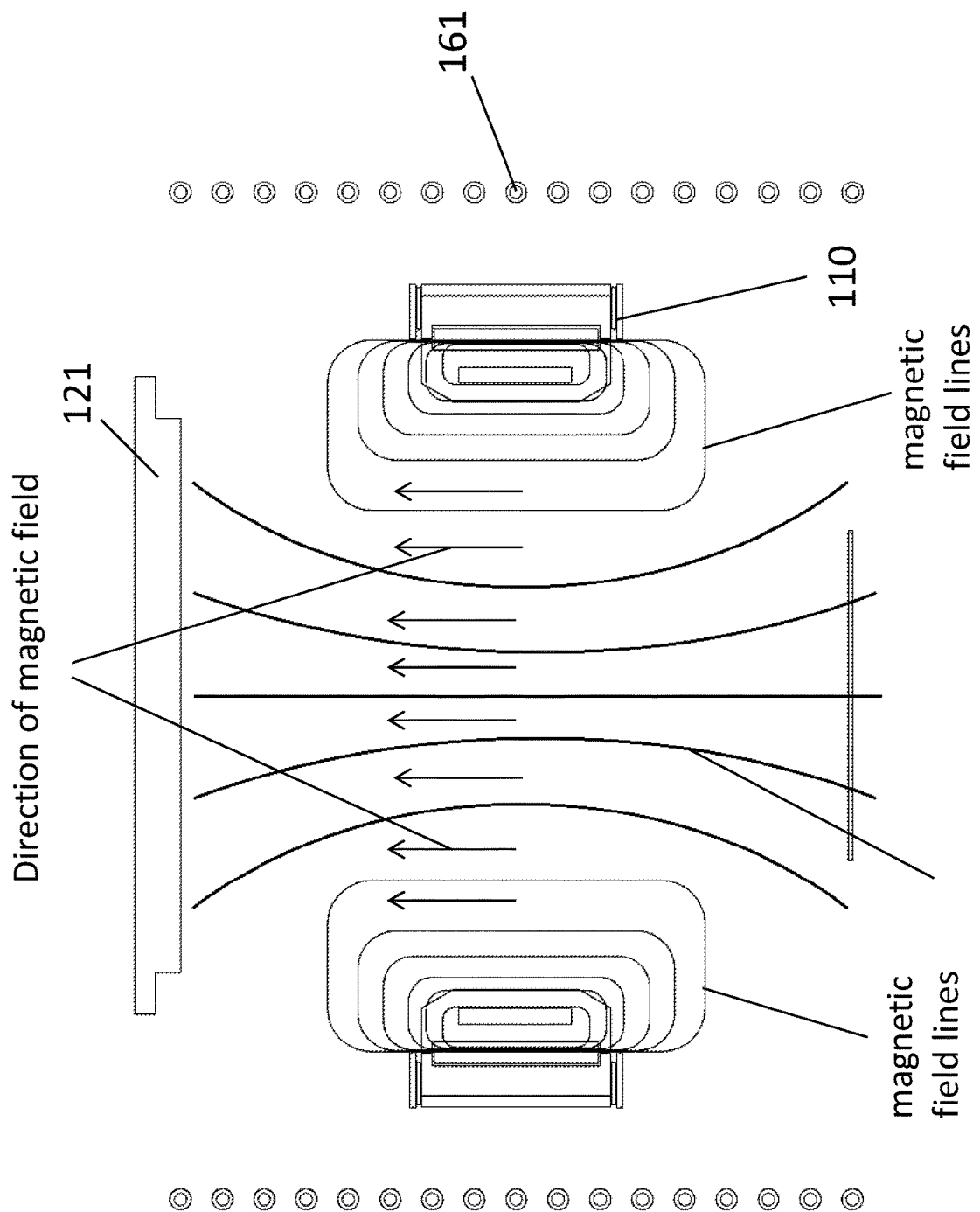
Figure 4E:
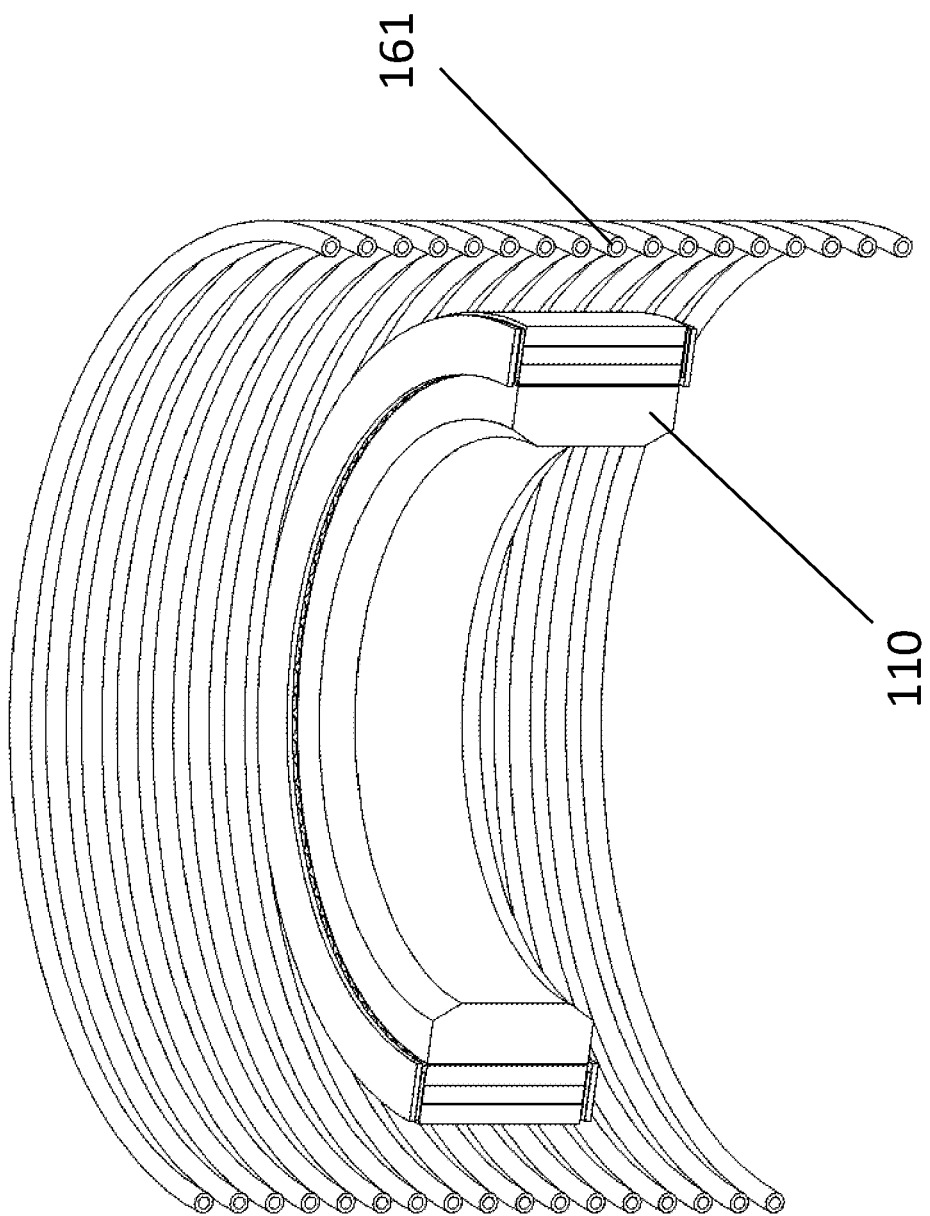
FIG. 4E is a perspective view of FIG. 4D.

The plasma follows the magnetic field and decreases as the magnetic field decreases from the cathode to the center of the process chamber, as illustrated in FIG. 4C. Additional electrical coils 161 or permanent magnets surrounding the Ionization plasma source 110 can form longer range magnetic field and extend magnetic strength into the center region of the plasma. FIGS. 4D and 4E show the set up where the electrical coils can enhance the magnetic field in the center region and improve the plasma uniformity. The electrical coil 161 should produce magnetic field in the substantially same directions as the permanent magnets 118 in the center region. The electrical coils 161 used to enhance the magnetic field can be placed outside the process chamber walls (not shown) or inside the process chamber. The coils and the three-dimensional closed-loop magnetron can generate a more uniform plasma when used together.

Electrical bias can be applied in the collimator to accelerate the ions. The acceleration voltage can be tuned. This can be done with the collimator assembly 130 in parallel to gas distribution device surface 122 or tilted relative to gas distribution device surface 122.

Figure 2A:
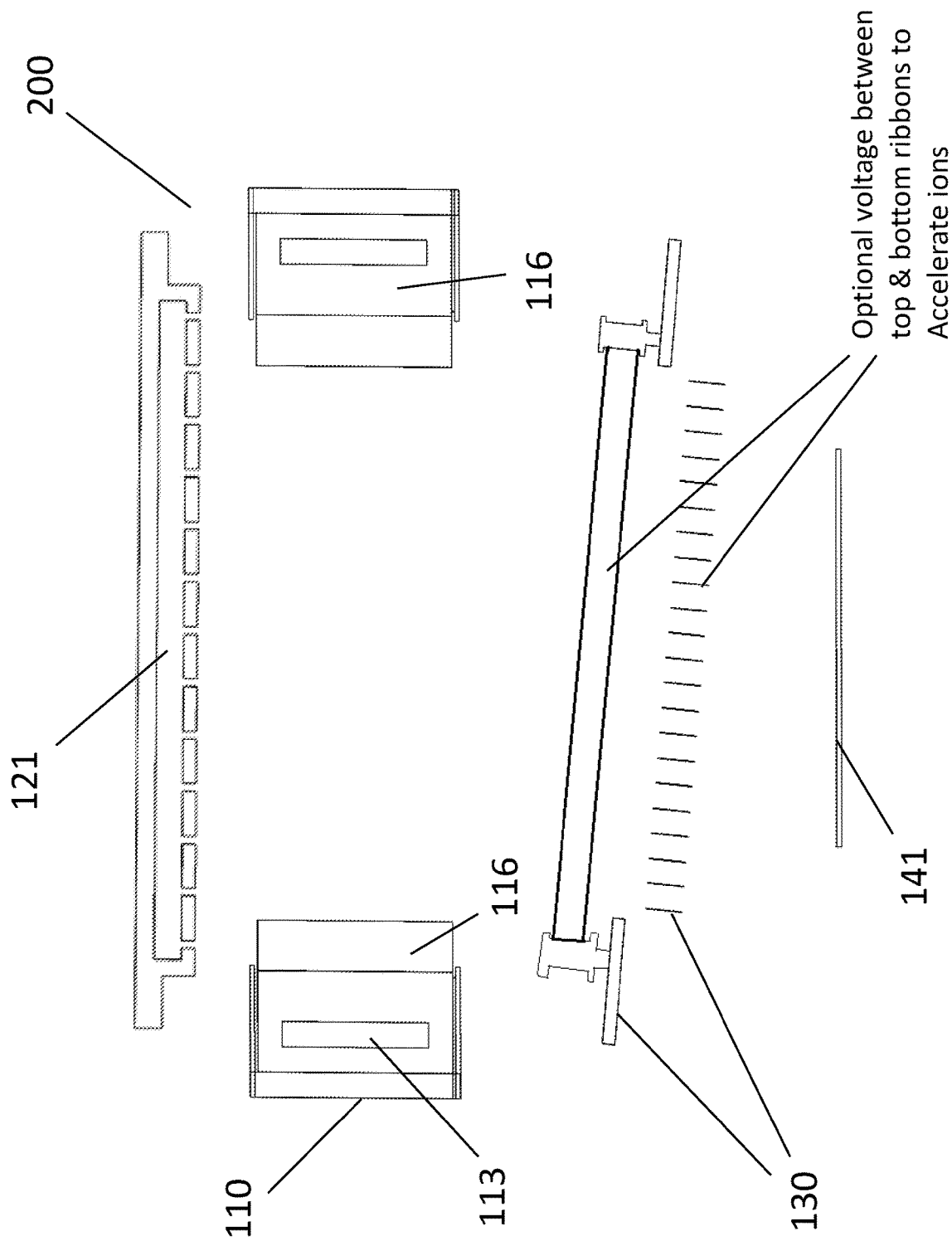
FIG. 2A is a sectional view of a plasma deposition and etch apparatus that includes a gas distribution device, a substrate, three-dimensional closed loop magnetron source plasma sources, and a collimator in accordance with the present invention. The collimator is tilted to allow the collimated beam to exit at an angle from the center axis.
Figure 2B:
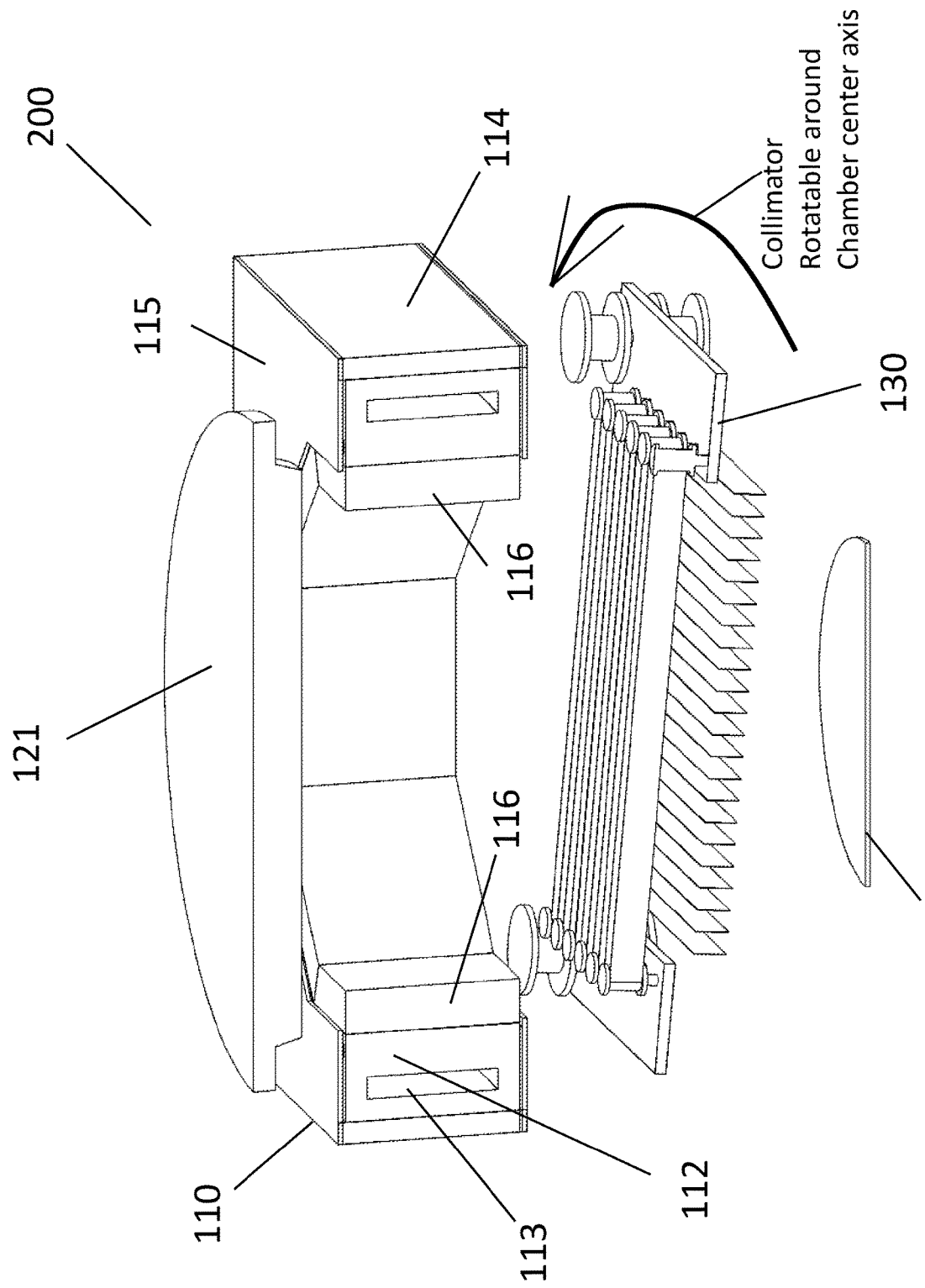
FIG. 2B is a perspective sectional view of the plasma deposition and etch apparatus FIG. 2A. The collimator can rotate around the center axis to improve deposition uniformity.

In FIGS. 2A-2B, a plasma deposition apparatus 200 includes similar components as those disclosed above in a plasma deposition and etch apparatus 100. The collimator is tilted relative to the center axis of the substrate. This will create a tilted beam relative to the center axis. The tilted beam can preferentially deposit more materials on sidewalls than the bottom of trenches. The whole collimator can also rotate around the center axis to reach uniformity. In one special case, the deposition can be done in discrete collimator rotation angles to align the deposition beam direction with the trenches on the substrate and enhance the deposition on the walls of the trenches. There may be more ways to tilt the ions and atoms that pass through the collimator, such as tilting the individual walls of the collimator. The substrate can also be rotated along its center axis while the collimator is stationary to achieve deposition uniformity.

Figure 2C:
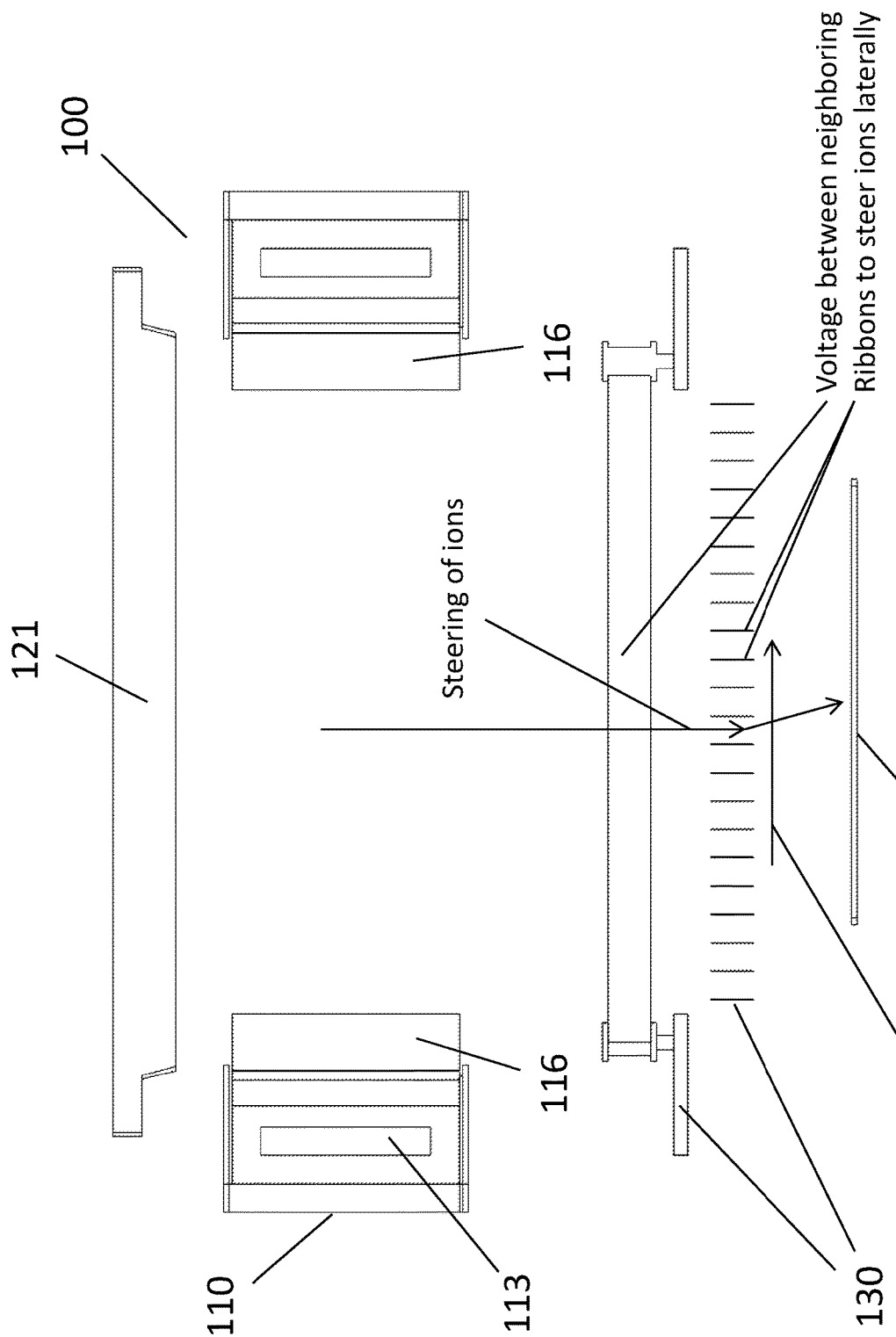
FIG. 2C shows each web or wall in a collimator is electrically biased to steer the ions and tilt the ion beam.

Another method to tilt the ion beam compatible with plasma deposition and etch apparatus 100 and 200 described above is to apply bias voltage between neighboring walls in the collimator, as shown in FIG. 2C. The ions that pass through the collimator will gain lateral velocity and arrive at the substrate at an angle. With two layers of webs or walls in a collimator, it is possible to steer the ion beam in all directions and achieve deposition uniformity without physically rotating the collimator. One way to apply bias between neighboring ribbons or webs is to use electrically insulating ribbons or webs and coat them with conductive materials on part of the ribbons between rollers 135 and keep the part of ribbon in contact with rollers 135 uncoated on both sides. Different voltage can be applied to the ribbons or webs without shorting them electrically. The rollers 135 and the tension and driving wheels 134 are mounted to plate 131.

The collimator can be electrically biased relative to the ground, the plasma source, and/or the substrate to manipulate the ions and align the ions. The collimator can be made of at least two electrically isolated parts; an electrical bias is placed between these two parts to accelerate, focus, and to add lateral velocity to the ions. The bias voltage and the tilt angle change the lateral velocity, while the bias on substrate determines the vertical velocity of the ions to control the angle of the arrival for the deposition or etchant ion. The ion angle should be optimized to match the aspect ratio and slope of trenches and via. For example, the angles of the sputtered ions should just reach the lower corner of the trenches or via to minimize deposition on the bottom while maximizing the deposition on the sidewalls of trench and via and avoid non-uniform deposition along the side walls. The substrate can be biased, grounded or float, with optional electron emission devices to neutralize the charges on the substrate.

The placement of collimator will also create a pressure differential between upper chamber and the space below the collimator and above the substrate when process gases are flown in between a gas distribution device 121 and the collimator assembly 130, further reducing the pressure and ion collisions with gas molecules in the process chamber after or during the final acceleration of ions towards substrate. The less collisions lead to more aligned ion beams.

Figure 1B:
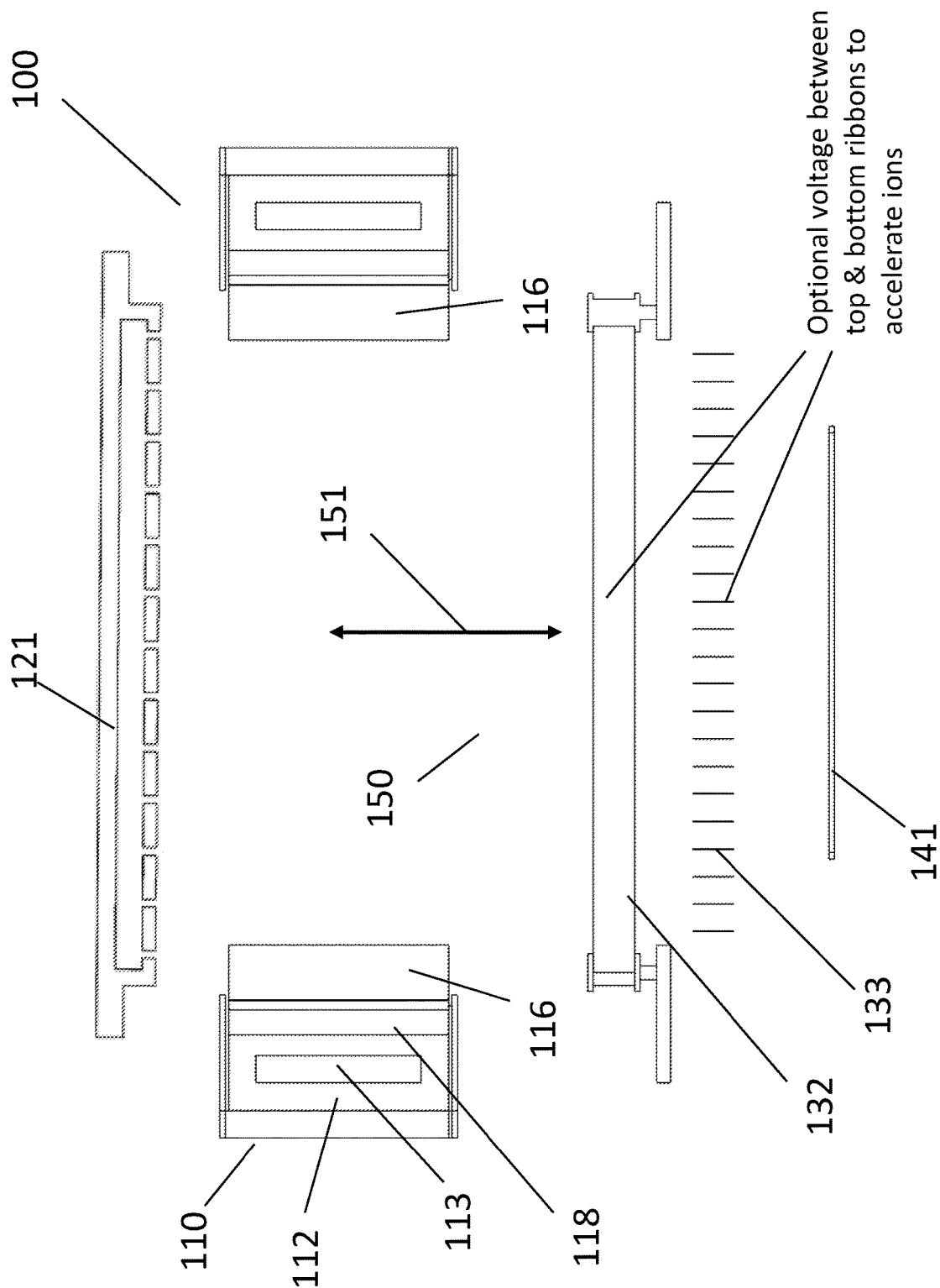
FIG. 1B is a sectional view of the plasma deposition and etch apparatus shown in FIG. 1A.
Figure 1C:
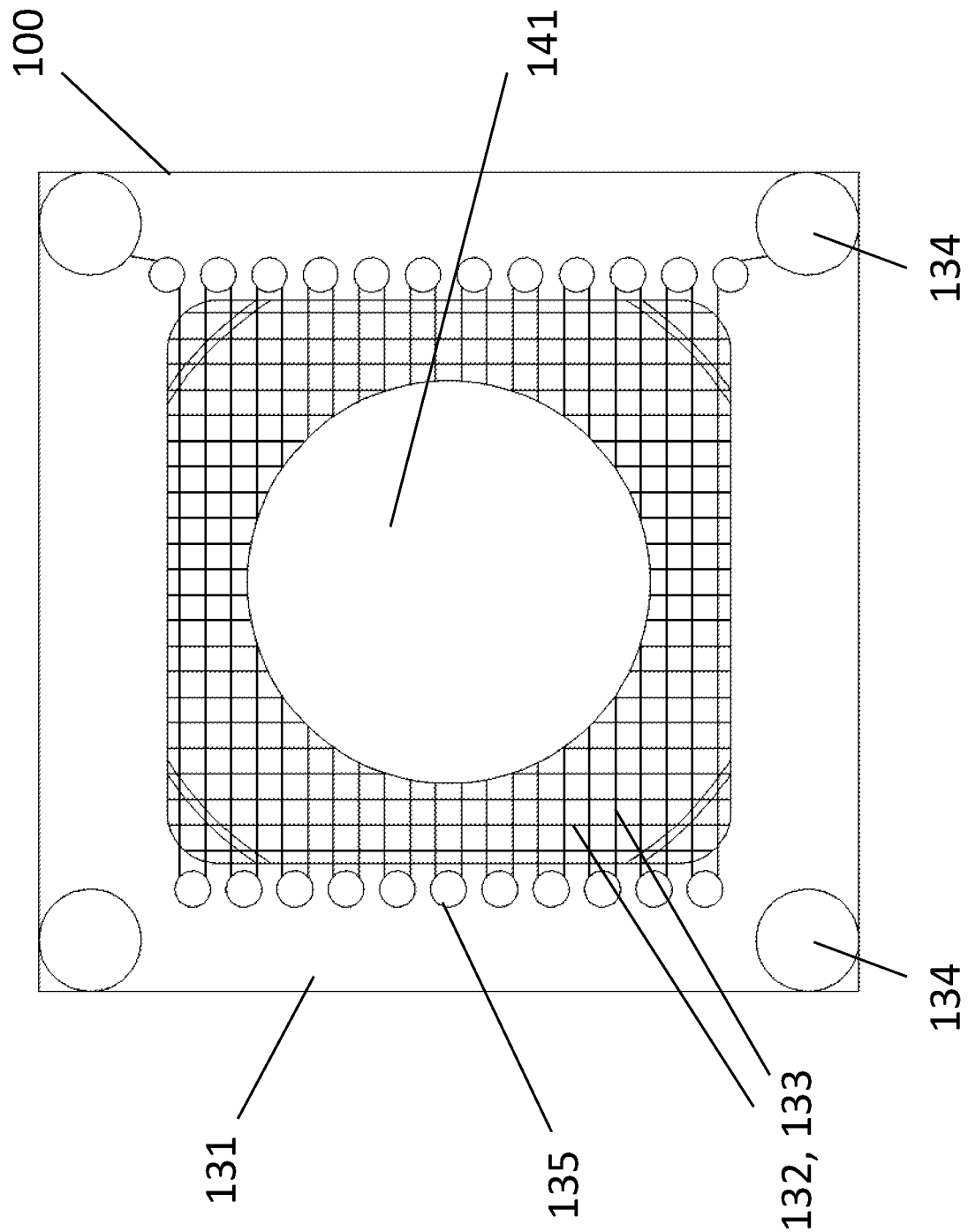
FIG. 1C is the view of collimator grid viewed from the direction normal to the substrate.

The collimator can be made of movable material to avoid excess deposition and particulates formation. Multiple ribbons or webs 132 and 133 are winding through rollers 135 to form parallel walls and form rectangle or polygon shaped grids when viewed from the substrate, as illustrated in FIG. 1C. The web thickness can be as thin as a few microns to minimize shadows of deposition on the substrate. The conventional collimator wall thickness is typically hundreds of microns to maintain the mechanical strength, the large wall thickness of the prior arts collimator blocks more deposition material and sometimes leaves images on substrate. By moving the webs at a constant rate relative to deposition rate, the average thickness of the web can be maintained constant throughout the entire lifetime to avoid the process drift seen in conventional collimator. Alternatively, the ribbons 132 and 133 can be moved at once to form all fresh collimator walls and the procedure is repeated after enough deposition on the collimator. The much-reduced deposition on the collimator ribbons 132 and 133 reduce particulates.

Figure 1D:
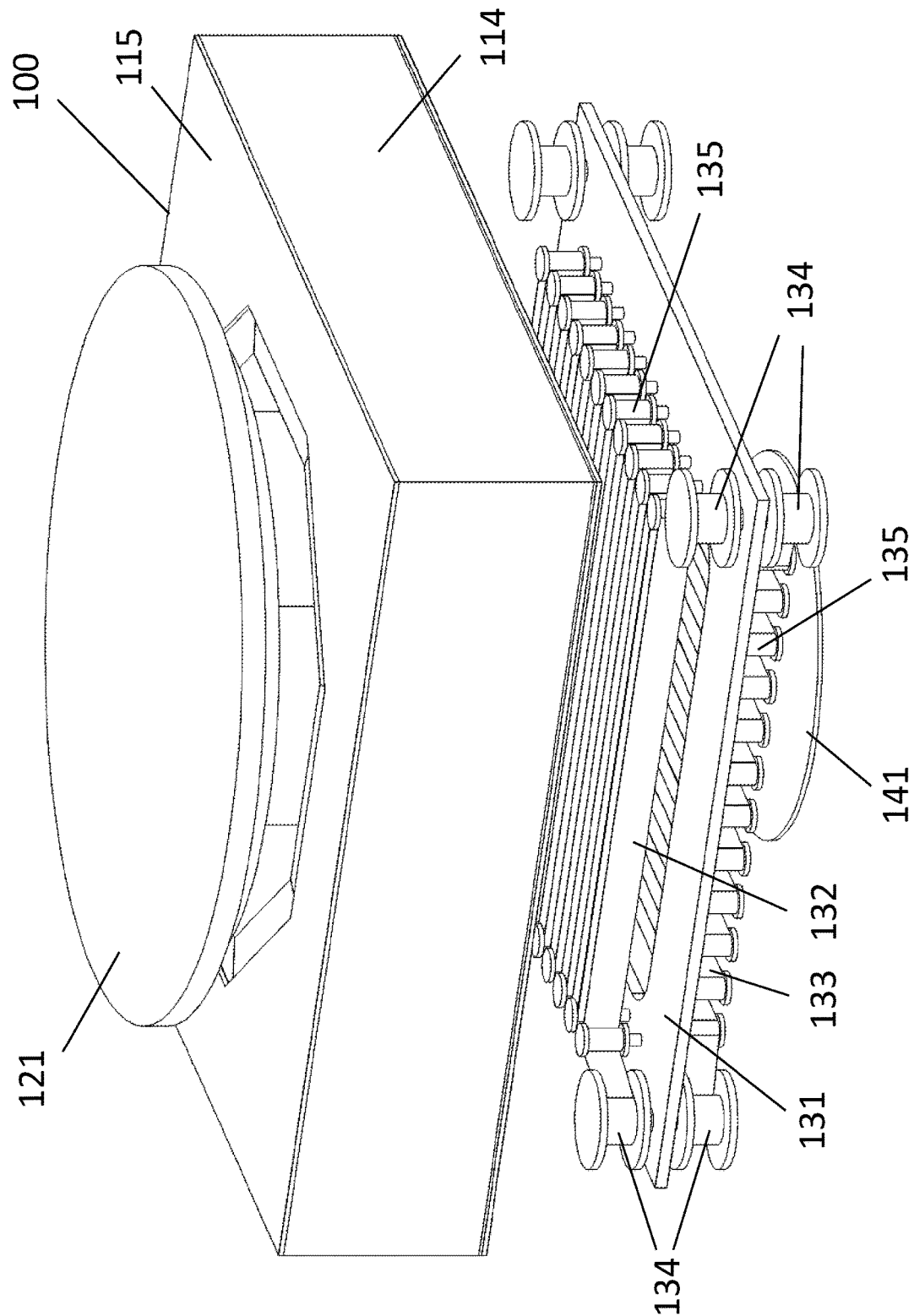
FIG. 1D is a perspective view of the plasma deposition and etch apparatus shown in FIG. 1A.

For some applications, electro-static chucks (ESC or E-chuck) are powered by RF power to induce a voltage called self-bias voltage; this voltage requires plasma near the substrate to have a net DC bias and the DC bias may be high due to the high power needed for process equipment throughput, low plasma density near the substrate, or geometry of various electrodes near the substrate. The disclosed collimator system can apply an accelerating voltage to the ions and direct the ions toward the substrate. The energy of the ions can be controlled by an external power supply and can range from zero to any voltage. FIG. 1D shows the bias between the two parts of collimator can be varied, FIG. 2C shows the accelerating voltage can be applied between various plates. Optional electron source can emit electrons and neutralize the accumulated ions on the substrate to prevent charge-up on the substrate. For example, hot filament coated with high electron emission efficiency materials can be heated to emit electrons and neutralize the charge-up on the substrate. This method improves the control of the ion energy and enables low energy ions at substrate and eliminates many limitations of the electro-static chuck. The electrode 116 has a closed-loop shape, such as a circle or a polygon. The closed-loop shape of the electrodes 116 defines a central region 150 therein and a central axis 151 through the central region and perpendicular to the closed loop (such as the circle and the polygon) of the electrodes 116.

Figure 1E:
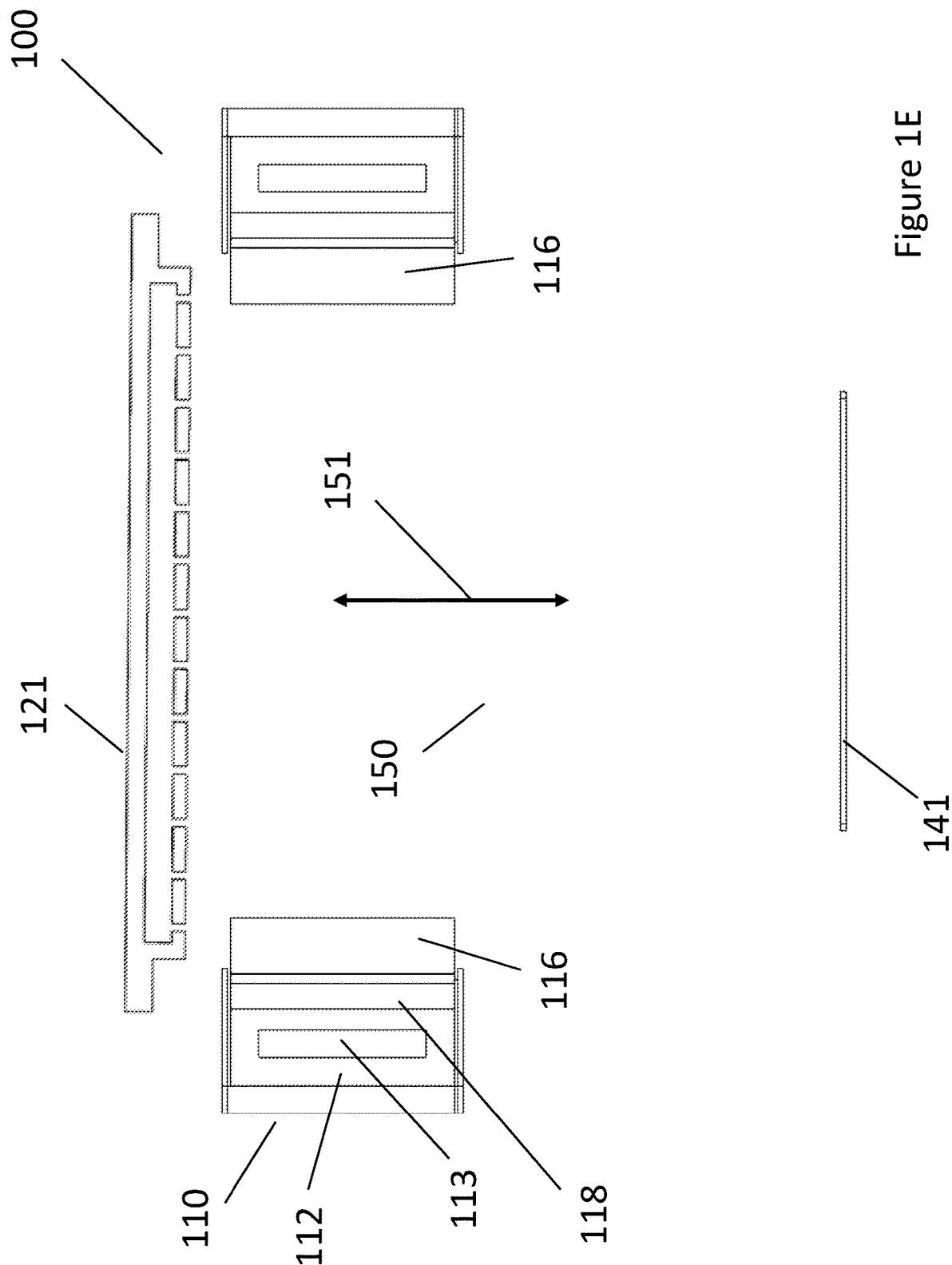
FIG. 1E shows the plasma deposition and etch apparatus similar to that shown in FIG. 1B without collimator assembly.

The collimator assembly in present invention can limit the angles of depositing or etchant atoms or ions at substrate 141. The collimator assembly may not be needed for some applications. The plasma density of the three-dimensional closed loop magnetron is much higher than conventional ionization sources such as inductive coil. The disclosed plasma source 110 in FIGS. 1A to 1E may fully ionize all or most atoms coming out of the gas distribution device 121 and greatly reduce the large off-angle deposition or off-angle etchant molecules and ions without collimator assembly. FIG. 1E illustrates the deposition or etch chamber with high efficiency plasma source and without use of collimator assembly.

Figure 3A:
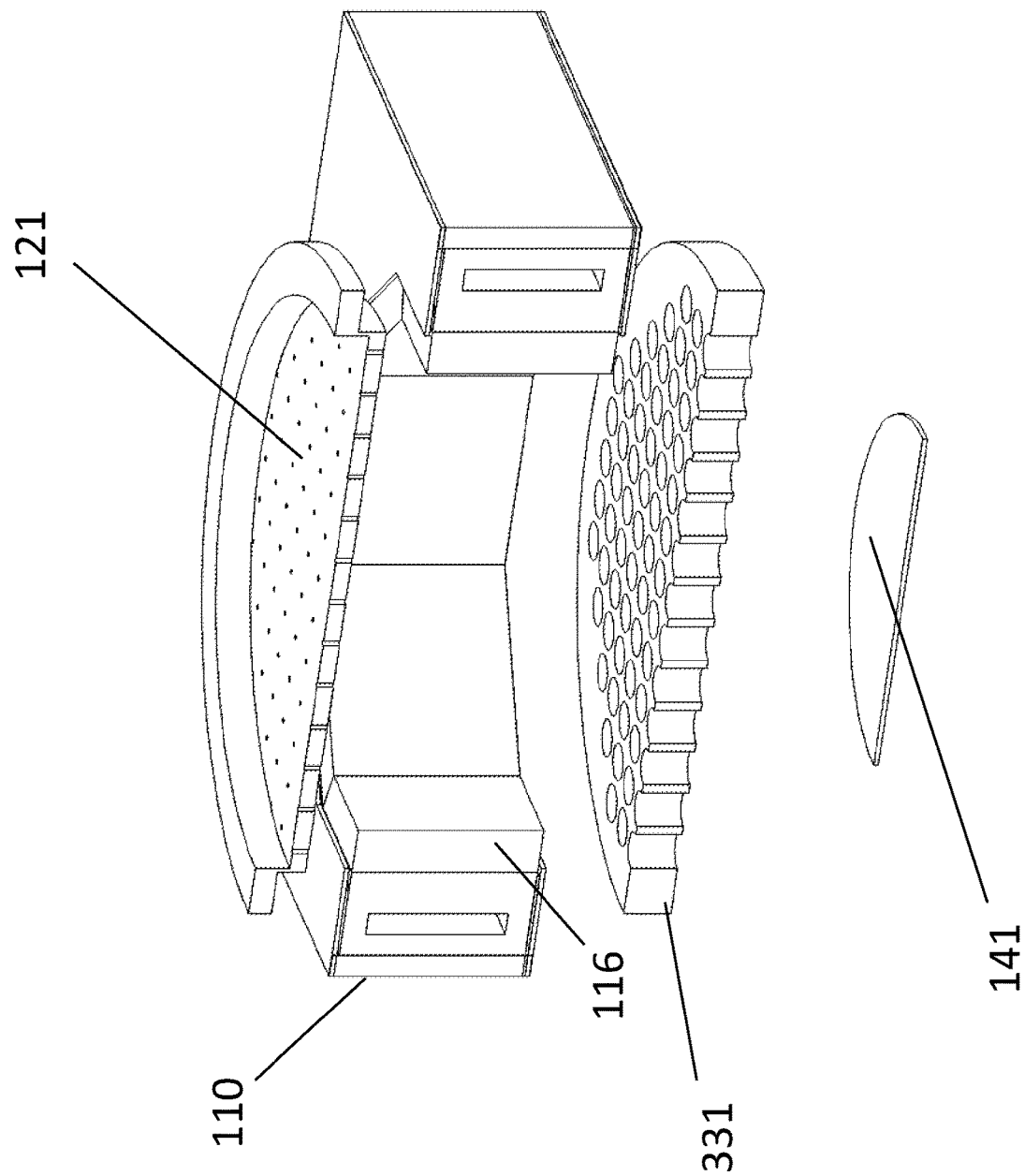
FIG. 3A illustrates a one-piece solid collimator.

Precursor gas molecules that are activated but not ionized have a chance to deposit on the collimator before reaching the substrate, reducing the clogging, or pinching of the trenches. In PECVD, chamber cleaning using etchant gas and plasma is a common practice. The collimator can be cleaned periodically to avoid particulate formation and to keep the collimator electrically conductive. In etching process, the etchant species do not deposit, and the etchant by-products can be cleaned periodically. A one-piece collimator 331 can be used to simplify the design, as shown in FIG. 3A.

Figure 3B:
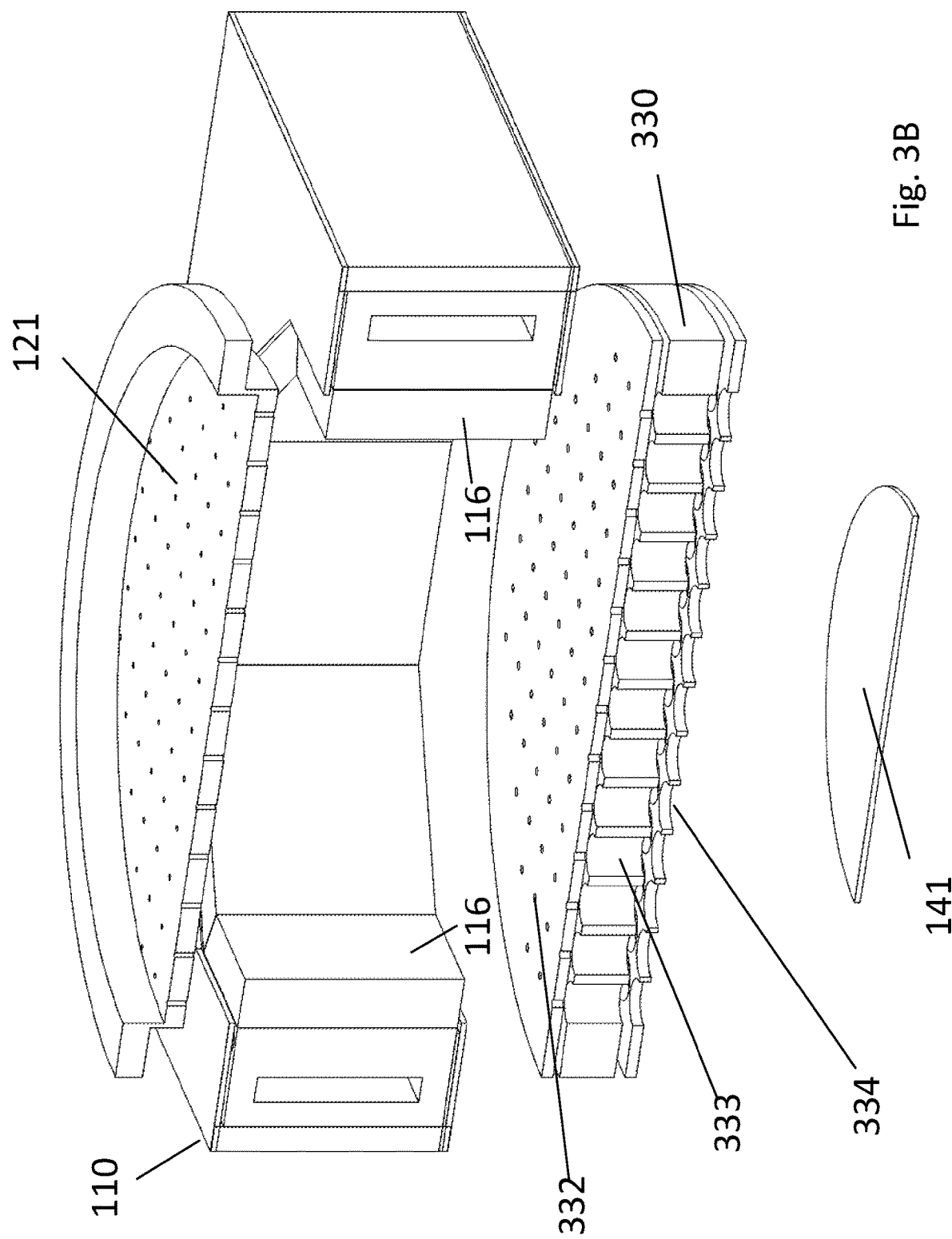
FIG. 3B illustrates a collimator made of multiple plates that can be biased to improve focusing and beam divergence. Bias can also control the energy of the ions that reach the substrate.
Figure 3C:
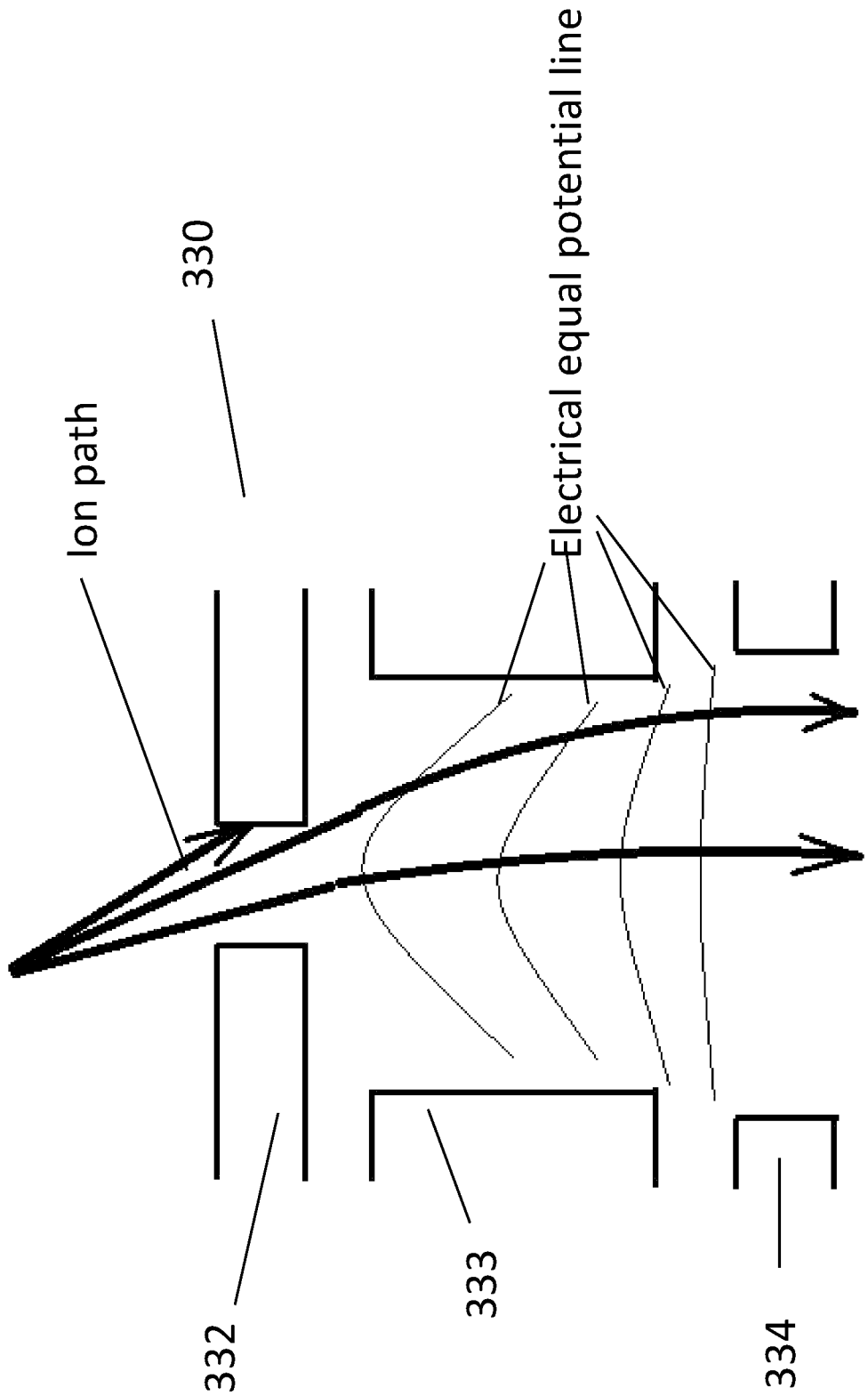
FIG. 3C illustrates the principle of electro-static focus by a collimator made of multiple plates that can be biased.
Figure 3D:
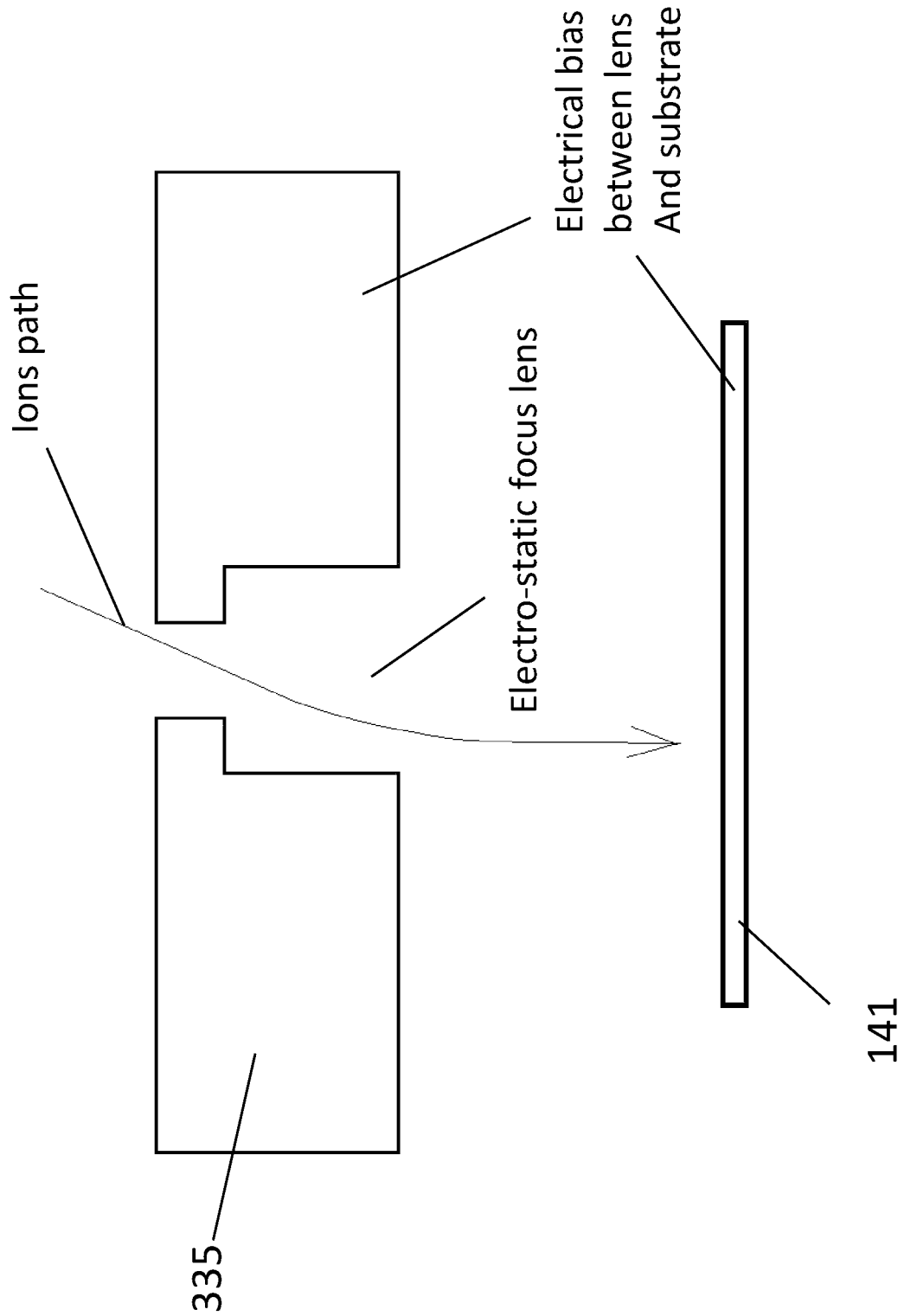
FIG. 3D illustrates the principle of electro-static focus by a collimator made of single plate that can be biased relative to the substrate.

A collimator 330 can be shaped as electro-static ion lenses to further focus and align the ions that pass through the collimator, as illustrated in FIGS. 3B-3C. The collimator 330 can be in flexible configurations including: an ion lens body entrance plate 332, an ion lens body 333, and an ion lens exit plate 334. The voltage between two electrically conductive plates 333 and 334 can create a concave electrical potential and focus the ions. The voltages on the electrically conductive plates 332 and 333 can be the same or different. The voltage on the electrically conductive plate 334 can be optimized to form a more parallel ion beam. The separate plates can be combined into a single ion lens body 335 in some cases to simplify the design, as shown in FIG. 3D, the potential difference between collimator and substrate can focus the ions coming out of the collimator. In case of plasma etch, the etchant gas or ions do not deposit on surfaces, and they can be focused into more parallel beams without much loss of etchant gas or ions. More parallel beams can increase the number of ions that reach the bottom of trenches and reduce the unnecessary plasma damage and heating of the substrate.

Figure 3E:
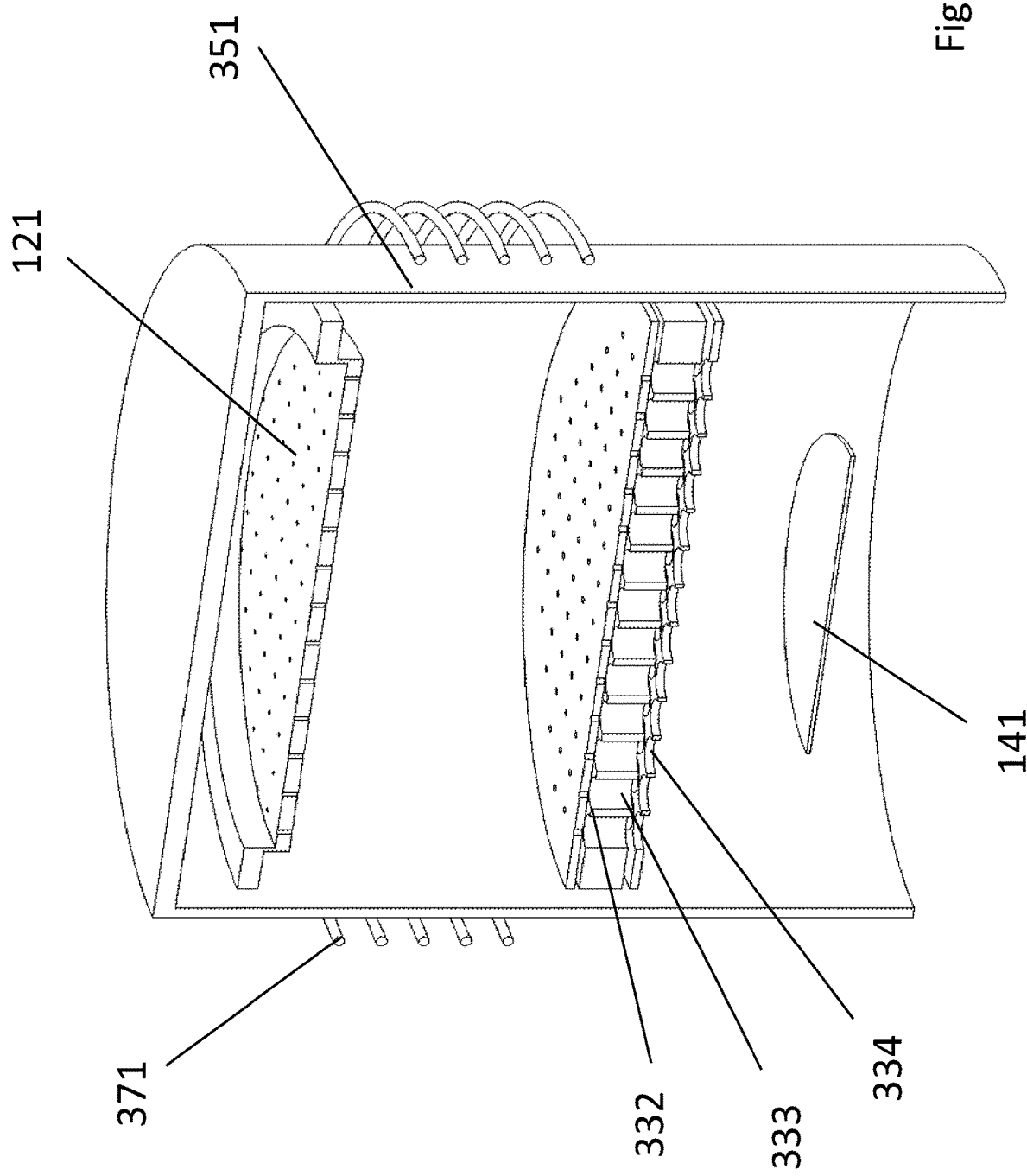
FIG. 3E illustrates a PECVD chamber where an inductive coil is the primary source of plasma. The coil is shown to be outside the vacuum chamber.

The primary plasma source can be inductive coils 371 as shown in FIG. 3E. The RF coil shown can be placed outside a non-conductive vacuum chamber wall 351 and induce plasma inside vacuum chamber or be placed inside the vacuum chamber 351 (not illustrated).

The placement of collimator will also create a pressure differential between upper chamber and the space below the collimator and above the substrate, further reducing the pressure and ion collisions with gas molecules in the process chamber after or during the final acceleration of ions towards substrate. The less collisions lead to more aligned ion beams.

For some applications, electro-static chucks (ESC or E-chuck) are powered by RF power to induce a voltage called self-bias voltage; this voltage requires plasma near the substrate and may be high due to the high power needed for process equipment throughput, low plasma density near the substrate, or geometry of various electrodes near the substrate. The disclosed collimator system can apply an accelerating voltage to the ions and direct the ions toward the substrate. The energy of the ions can be controlled by an external power supply and can range from zero to any voltage. FIGS. 1B and 2A show the bias between the two parts of collimator 132 and 133 can be varied, FIG. 2C shows the accelerating voltage can be applied between various plates to accelerate ions in vertical direction and laterally to change the energy and angles of the ions. Optional electron source can emit electrons and neutralize the accumulated ions on the substrate to prevent charge up on the substrate. For example, hot filament coated with high electron emission efficiency materials can be heated to emit electrons and neutralize the charge up on the substrate. This method improves the control of the ion energy and enables low energy ions at substrate and eliminates many limitations of the electro-static chuck.

Figure 5A:
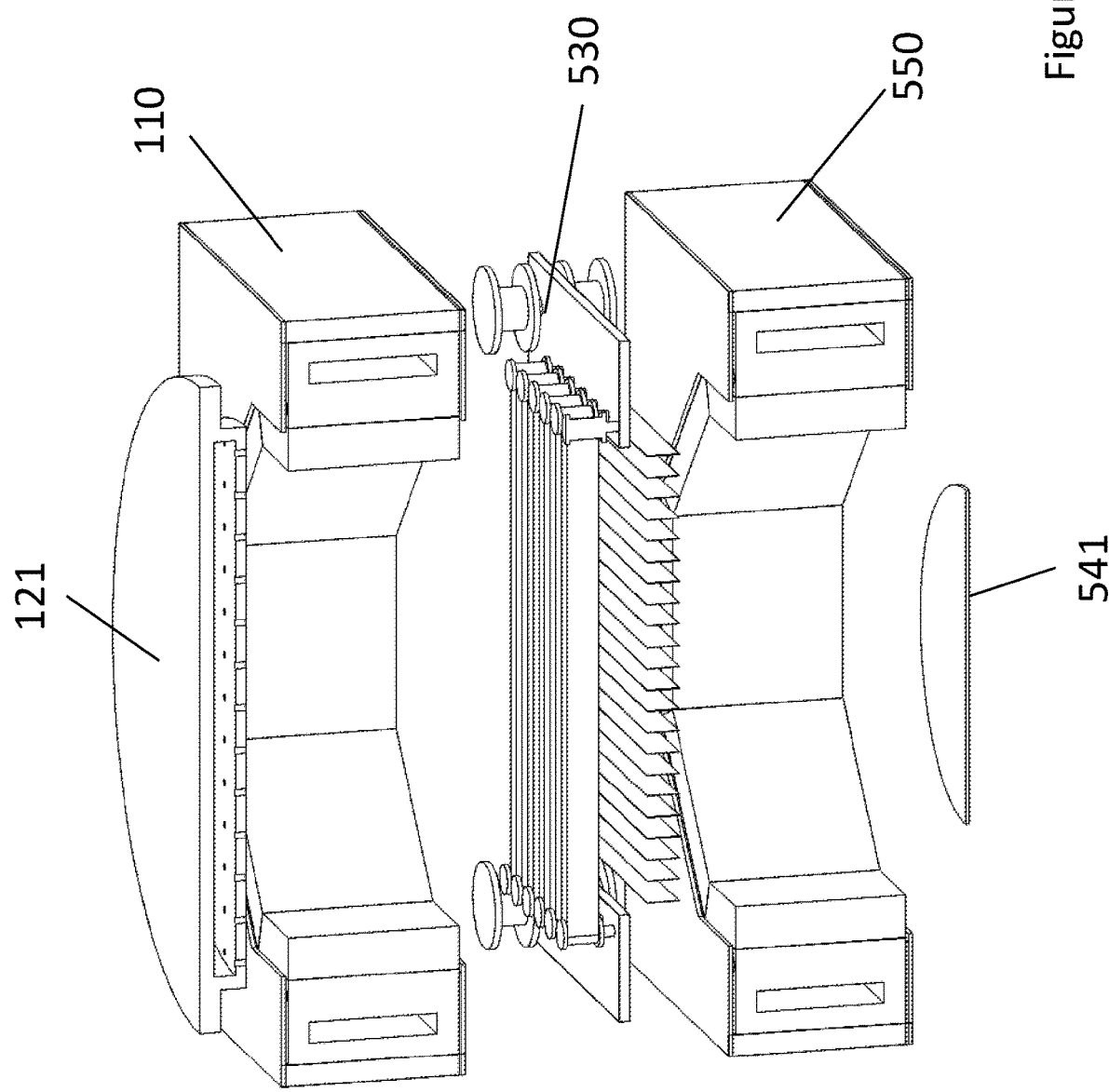
FIGS. 5A and 5B illustrate how an additional plasma source can create plasma near a substrate in the vacuum deposition and etch system in accordance with the present invention.
Figure 5B:
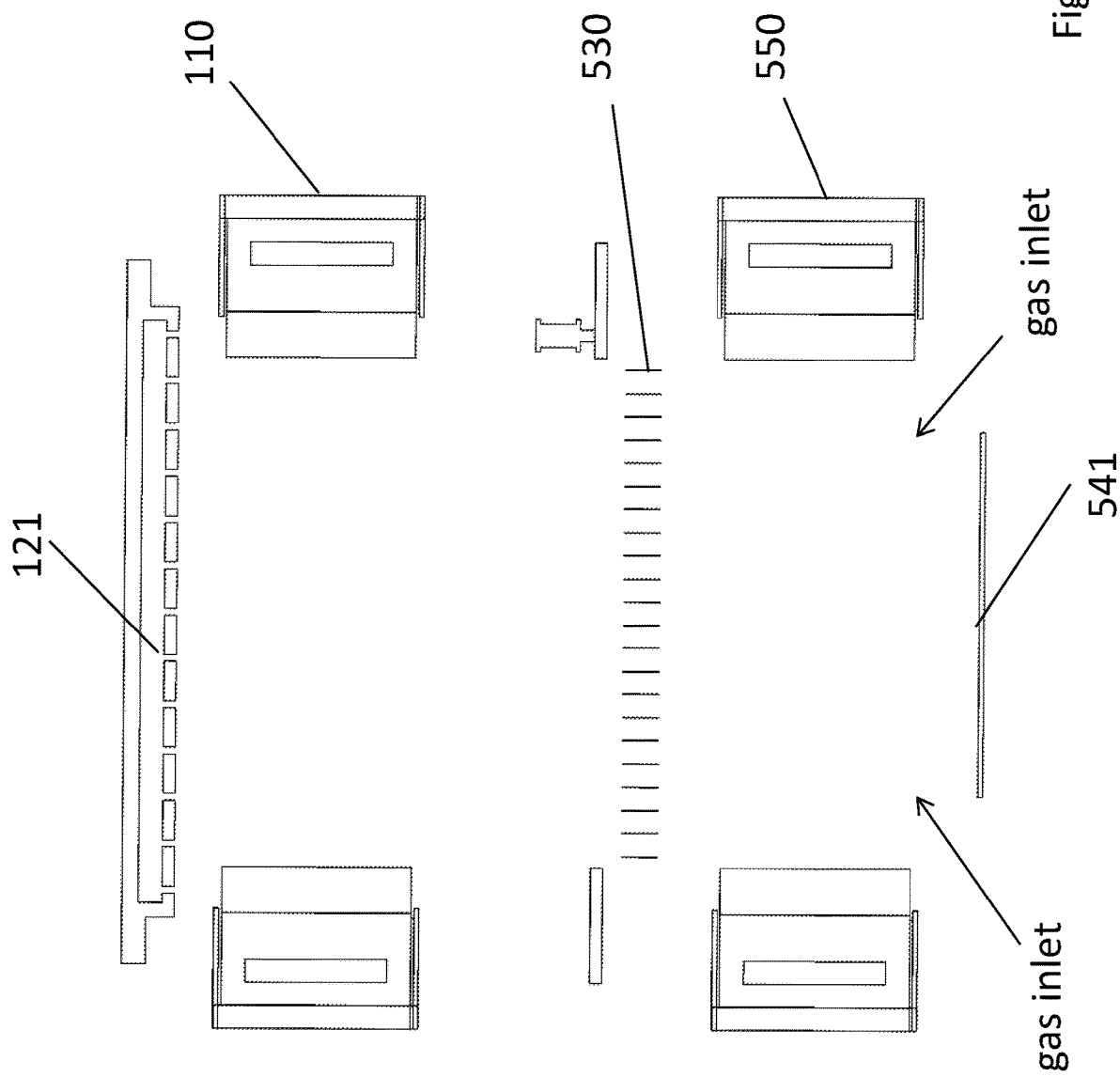

Referring to FIGS. 5A and 5B, a secondary plasma source 550 is disposed between a collimator 530 and a substrate 541 to create plasma below collimator 530 to enable the formation of self-bias voltage on substrate 541, and to generate electrons and to neutralize the depositing ions, or to neutralize substrate 541 to avoid charge buildup on the substrate 541. The three-dimensional closed loop magnet confined plasma source 550 is the additional plasma source shown in FIGS. 5A and 5B. Other types of plasma sources such as inductive coil, microwave, electron cyclotron resonance (ECR), or other plasma apparatus can replace the plasma source 550 shown in FIGS. 5A and 5B. The self-bias voltage on the substrate can be controlled by the power applied to additional plasma source 550; a higher plasma density will result in lower self-bias voltage at substrate 541.

Figure 6A:
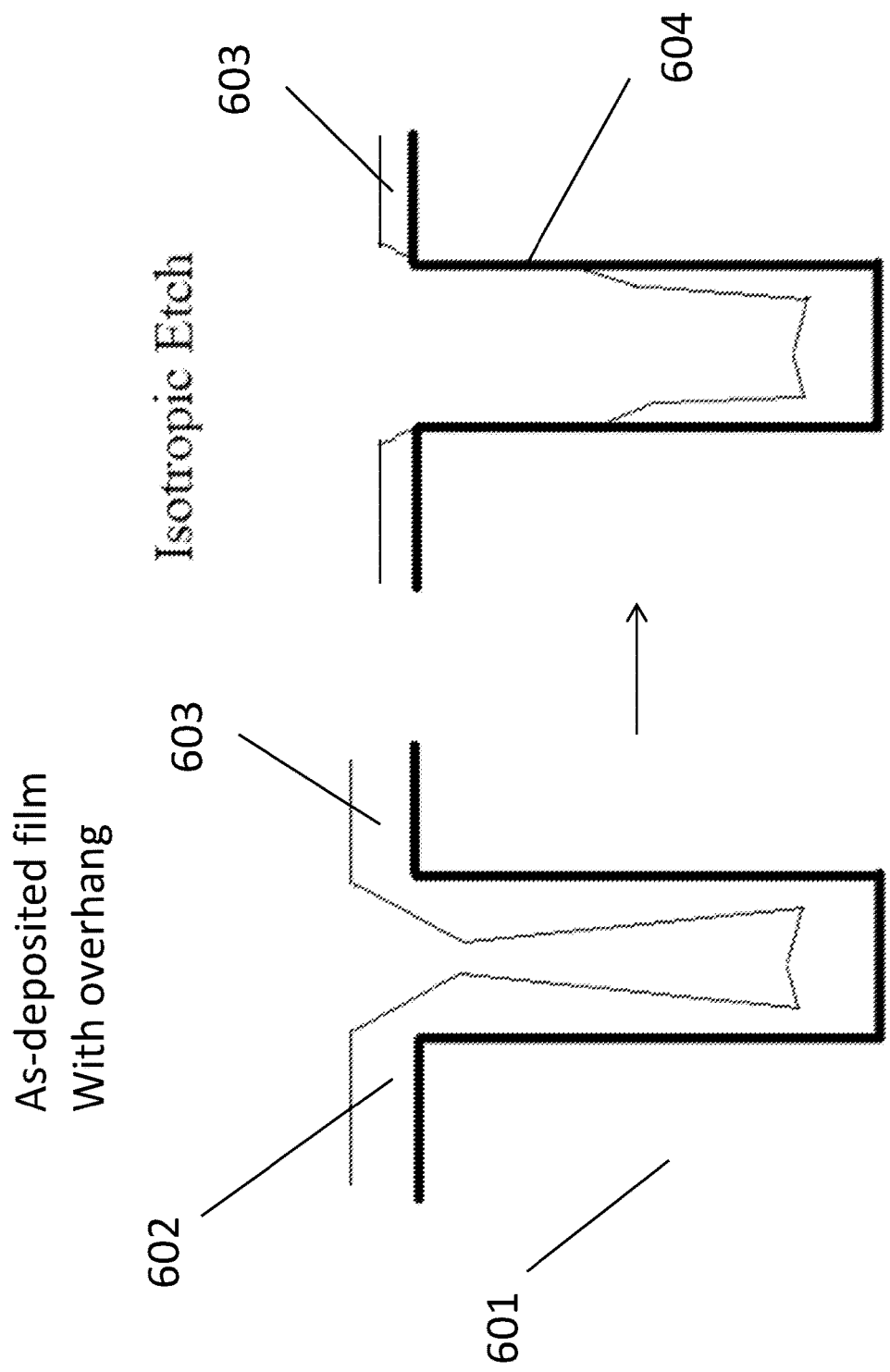
FIG. 6A shows the etching of the deposited films by plasma and chemical etch in isotropic etch, with low energy ions in the vacuum deposition system in accordance with the present invention.

Another method to reduce the re-sputtering of the substrate and pinching of the trench entrance is the removal of the re-sputtered materials and overhang by chemical or plasma reactions. Etchant gases such as NF3, CF4, C2F6, Cl2, HCL, BCL3, or other metal or dielectric etching gases, etc. are flown into the process chamber and may form optional plasma with reduced or without substrate bias. The reduced bias will make the etching less directional and preferentially remove material near the entrance of trenches and via. The resulting activated etchant gases will react with the films on the substrate and remove them. Referring to FIG. 6A, film 603 is deposited on high aspect ratio substrate 601 without etching as illustrated on the left side of FIG. 6A. The re-sputtered material or overhang 602 is near the entrance of trenches. The upper portion of sidewalls 604 of trenches can be etched by isotropic etching, and overhang 602 be reduced or removed to avoid pinching of the trenches and via, as illustrated in right hand side of FIG. 6A. Low energy ions are formed due to the lack of high voltage and low frequency activation voltages from the additional plasma source, which leads to low or no directionality of etchant species. The deposition can continue after removal of the materials near the entrance of trenches and via. The etch step can be repeated multiple times during the process. Alternatively, deposition and etching can be carried out simultaneously to etch the top portion of trench or via near the entrance.

When it is desirable to have the etching and deposition done at the same time, it is important to have low velocity for the etching gas or ions to avoid etching of the bottom of trench and via. Referring to FIGS. 5A and 5B, the precursor ions above collimator 530 are accelerated by collimator 530 to deposit on substrate 541 and the precursor ions are perpendicular to substrate surface 541. The electrical potential between the lower surface of collimator 530 and substrate surface 541 is kept small or zero in this case. The etching gas flows below the collimator and is ionized by the additional plasma source 550 without gaining much energy. The additional plasma source 550 between collimator 530 and substrate 541 is used to activate the etching gas flown in near the substrate and below the collimator. The additional plasma source can be inductive coil, closed loop magnetron 550 as shown in FIGS. 5A and 5B, microwave, electron cyclotron resonance (ECR), or other apparatus. These etchant gases are flown near the substrate, below the collimator to etch the substrate; while the directional deposition ions are filling the trenches, and via.

Figure 6E:
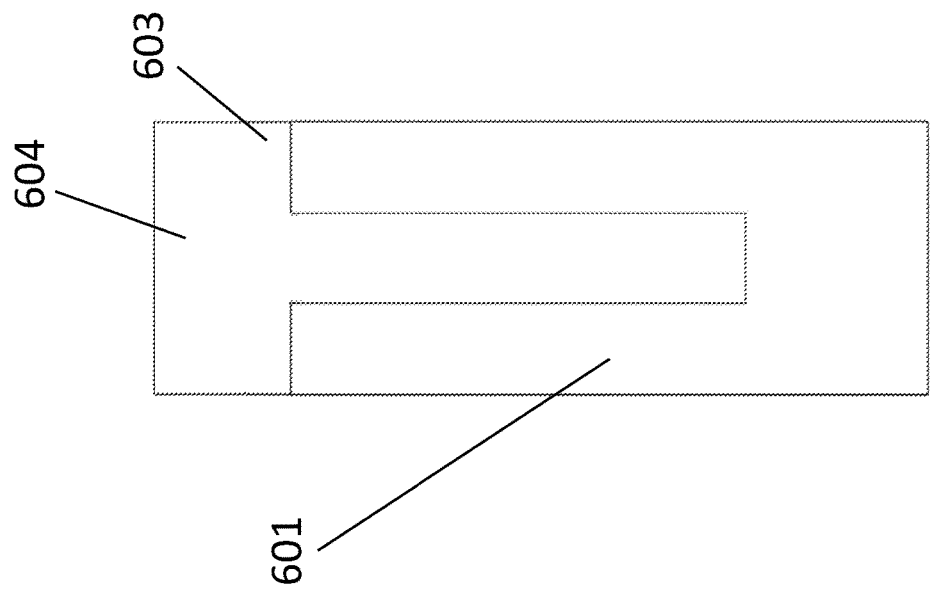
Figure 6D:
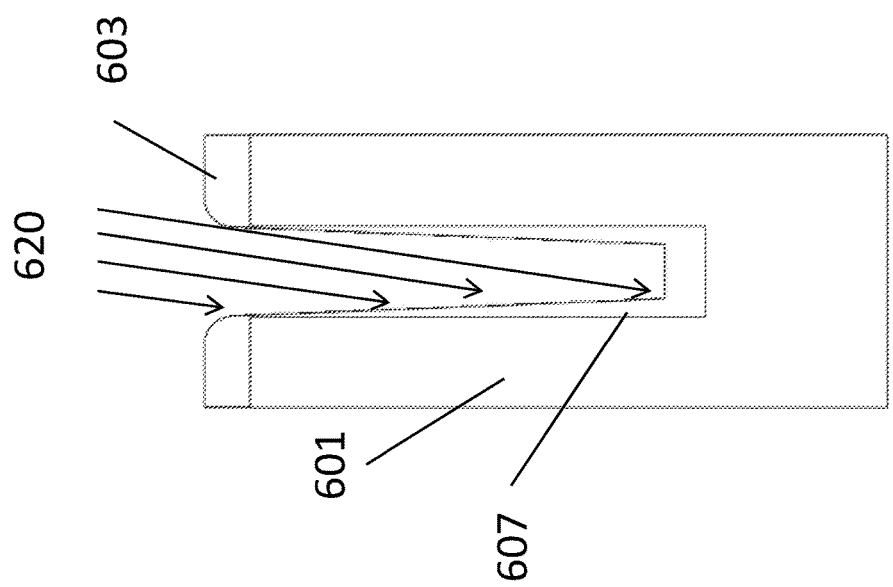

To remove the deposition on the sidewalls without re-depositing them nearby, ionized inert gases such as Argon or reactive gas such as CF4, NF3, Cl2, HCl . . . can be ionized and tilted to only etch the sidewalls and remove the film. Even partially removing the film near the top of trenches will reduce the effective aspect ratio of the trenches or via to make gap fill easier. FIGS. 6B, 6C, and 6D show the as-deposited film 603 with overhang 602 on substrate 601; partial etch of top side walls 606 by tilted ion beam 620; and etch of lower side walls 607 as the ion beam is less tilted, respectively. Ion beam 620 can operate at optimized angles and optimized time duration to preferentially etch off more film at upper part of the trench than the lower part of the trenches, forming sloped side walls as shown in FIG. 6D. The tilted ion beam 620 should rotate along the vacuum chamber center axis to achieve good uniformity. More depositions 604 are performed to fill the trench shown in FIG. 6D, until the trench or via are completely filled as shown in FIG. 6E. If the incoming ion beam is parallel, a small tilt will etch the entire sidewalls while a larger tilt will only etch the upper port of the sidewall; the tilted beam can have different time duration at different angles to form a sloped sidewall, and the tilted beam can rotate around substrate to remove materials on all sidewalls uniformly.

The invention claimed is:

1. A plasma deposition apparatus, comprising:
 a first plasma source configured to produce a first plasma confined in a magnetic field, comprising:

a gas distribution device configured to supply a gas;

a closed-loop electrode defining a center region therein and a central axis through the central region; and one or more magnets that are outside an inner surface of the closed-loop electrode, wherein the one or more magnets are configured to produce the magnetic field in the center region, wherein the closed-loop electrode and the one or more magnets are configured to produce the first plasma of activated atoms, molecules, electrons, and ions from the gas; and a collimator configured to collimate the activated atoms, molecules, electrons, and ions produced by the first plasma source and to direct the ions to a substrate, wherein the collimator comprises:

parallel ribbons; and a transport mechanism configured to move the parallel ribbons to expose clean portions of the parallel ribbons to deposition.

2. The plasma deposition apparatus of claim 1, wherein the closed-loop electrode has a circular shape or a polygon shape.

3. The plasma deposition apparatus of claim 1, wherein the one or more magnets are positioned in a closed loop in the closed-loop electrode.

4. The plasma deposition apparatus of claim 1, wherein the one or more magnets are fully embedded in the closed-loop electrode.

5. The plasma deposition apparatus of claim 1, wherein the one or more magnets are partially embedded in the closed-loop electrode.

6. The plasma deposition apparatus of claim 1, wherein the gas distribution device is electrically biased relative to ground.

7. The plasma deposition apparatus of claim 1, wherein the first plasma source is disposed between the gas distribution device and the substrate, wherein the collimator is disposed between the first plasma source and the substrate.

8. The plasma deposition apparatus of claim 1, wherein the collimator comprises:

a first set of the parallel ribbons; and a second set of the parallel ribbons, wherein the second set of parallel ribbons is displaced from the first set of parallel ribbons along the central axis, wherein the first set of parallel ribbons and the second set of parallel ribbons are crossed at a substantial angle, wherein the first set of parallel ribbons and the second set of parallel ribbons are configured to collimate the activated atoms, molecules, electrons, and ions produced by the first plasma source and to direct the ions to the substrate.

9. The plasma deposition apparatus of claim 8, wherein the first set of parallel ribbons and the second set of parallel ribbons are crossed substantially at an orthogonal angle.

10. The plasma deposition apparatus of claim 8, wherein the first set of parallel ribbons are electrically biased relative to the second set of parallel ribbons to steer the ions.

11. The plasma deposition apparatus of claim 8, wherein at least some neighboring ribbons in the first set of parallel ribbons and the second set of parallel ribbons are electrically biased relative to each other to steer the ions.

12. The plasma deposition apparatus of claim 8, wherein the first set of parallel ribbons are moveable by a first transport mechanism, wherein the second set of parallel ribbons are moveable by a second transport mechanism.

13. The plasma deposition apparatus of claim 1, wherein the collimator comprises:

an electrically conductive plate comprising a plurality of holes, wherein the electrically conductive plate is electrically biased relative to the substrate such that electric potential at the plurality of holes is configured to focus and direct the ions to the substrate.

14. The plasma deposition apparatus of claim 1, wherein the collimator comprises:

a stack of plates each comprising a plurality of holes, wherein at least one of the plates is electrically biased relative to the substrate such that electric potential at the plurality of holes in the at least one of the plates is configured to focus and direct the ions to the substrate.

15. The plasma deposition apparatus of claim 1, wherein the first set of parallel ribbons are configured to have surfaces substantially parallel to the central axis, wherein a second set of parallel ribbons are configured to have surfaces substantially parallel to the central axis.

16. The plasma deposition apparatus of claim 1, wherein the first set of parallel ribbons and the second set of parallel ribbons are rotatable around the central axis.

17. The plasma deposition apparatus of claim 1, wherein the first plasma source further comprises:

an electrical coil configured to increase uniformity of the magnetic field in the center region.

18. The plasma deposition apparatus of claim 1, further comprising:

a second plasma source disposed between the collimator and the substrate, configured to generate a second plasma and neutralize ions in the first plasma.

* * * * *